(12) United States Patent
Tsai et al.

(10) Patent No.: US 10,867,834 B2
(45) Date of Patent: Dec. 15, 2020

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Min-Ying Tsai, Kaohsiung (TW); Yeur-Luen Tu, Taichung (TW)

(73) Assignee: TAIWAN SEMICONDUCTOR MANUFACTURING COMPANY LTD.

( * ) Notice: Subject to any disclaimer, the term of this patent is extended or adjusted under 35 U.S.C. 154(b) by 506 days.

(21) Appl. No.: 15/088,131

(22) Filed: Apr. 1, 2016

(65) Prior Publication Data
US 2017/0194194 A1  Jul. 6, 2017

Related U.S. Application Data

(60) Provisional application No. 62/273,466, filed on Dec. 31, 2015.

(51) Int. Cl.
*H01L 23/52* (2006.01)
*H01L 21/762* (2006.01)
(Continued)

(52) U.S. Cl.
CPC ...... *H01L 21/76251* (2013.01); *H01L 21/304* (2013.01); *H01L 21/30604* (2013.01);
(Continued)

(58) Field of Classification Search
CPC .............. H01L 23/5384; H01L 23/562; H01L 21/76254; H01L 24/28; H01L 24/98;
(Continued)

(56) References Cited

U.S. PATENT DOCUMENTS 5,391,257 A * 2/1995 Sullivan ............ H01L 21/76251
117/915
5,654,583 A * 8/1997 Okuno .................. B82Y 20/00
257/627
(Continued)

FOREIGN PATENT DOCUMENTS

TW     201034173 A1    9/2010
TW     201205688       2/2012

OTHER PUBLICATIONS

Zhu, Z.-H., et al. Wafer bonding technology and its applications in optoelectronic devices and materials. IEEE Journal of Selected Topics in. Quantum Electronics, 1997, 3. Jg., Nr. 3, S. 927-936.
(Continued)

*Primary Examiner* — Mary A Wilczewski
*Assistant Examiner* — Tsz K Chiu
(74) *Attorney, Agent, or Firm* — Haynes and Boone, LLP

(57) ABSTRACT

The present disclosure provides a semiconductor structure, including a first semiconductor device having a first surface and a second surface, the second surface being opposite to the first surface, a semiconductor substrate over the first surface of the first semiconductor device, and a III-V etch stop layer in contact with the second surface of the first semiconductor device. The present disclosure also provides a manufacturing method of a semiconductor structure, including providing a temporary substrate having a first surface, forming a III-V etch stop layer over the first surface, forming a first semiconductor device over the etch stop layer, and removing the temporary substrate by an etching operation and exposing a surface of the III-V etch stop layer.

20 Claims, 26 Drawing Sheets

(51) Int. Cl.
*H01L 21/304* (2006.01)
*H01L 21/306* (2006.01)
*H01L 25/00* (2006.01)
*H01L 27/146* (2006.01)
*H01L 23/00* (2006.01)
*H01L 21/02* (2006.01)
*H01L 25/065* (2006.01)

(52) U.S. Cl.
CPC ........ *H01L 21/30608* (2013.01); *H01L 24/00* (2013.01); *H01L 24/80* (2013.01); *H01L 25/50* (2013.01); *H01L 27/14643* (2013.01); *H01L 27/14687* (2013.01); *H01L 21/02381* (2013.01); *H01L 21/02461* (2013.01); *H01L 21/02532* (2013.01); *H01L 25/0657* (2013.01); *H01L 2224/08145* (2013.01); *H01L 2224/94* (2013.01)

(58) Field of Classification Search
CPC ............. H01L 21/2007; H01L 21/6835; H01L 21/76898; H01L 24/80; H01L 24/83; H01L 24/92; H01L 25/50; H01L 2924/01322; H01L 2224/73204; H01L 2924/10253; H01L 2224/803; H01L 27/14601; H01L 27/14687; H01L 27/14689; H01L 27/1464; H01L 21/304; H01L 27/124–1244; H01L 27/1296; H01L 27/3274; H01L 27/3246; H01L 27/3283; H01L 27/3295; H01L 27/3248; H01L 51/5206–5218; H01L 31/0304–03048; H01L 31/184–1856; G02F 1/1345–13458
See application file for complete search history.

(56) References Cited

U.S. PATENT DOCUMENTS

| | | | | |
|---|---|---|---|---|
| 6,455,398 | B1 * | 9/2002 | Fonstad, Jr. | G02B 6/1245 257/E21.088 |
| 6,906,359 | B2 * | 6/2005 | Zampardi | H01L 27/0605 257/192 |
| 7,169,685 | B2 * | 1/2007 | Connell | H01L 21/78 257/E21.599 |
| 7,432,149 | B2 | 10/2008 | Wu et al. | |
| 8,288,250 | B2 * | 10/2012 | Clavelier | H01L 21/7813 438/459 |
| 8,461,017 | B2 | 6/2013 | Sadaka et al. | |
| 9,768,221 | B2 * | 9/2017 | Wu | H01L 27/1464 |
| 9,799,587 | B2 * | 10/2017 | Fujii | H01L 24/08 |
| 2004/0043548 | A1 * | 3/2004 | Redd | H01L 21/30612 438/185 |
| 2004/0129941 | A1 * | 7/2004 | Dokumaci | B82Y 10/00 257/66 |
| 2005/0087762 | A1 * | 4/2005 | Zampardi | H01L 27/0605 257/192 |
| 2006/0076559 | A1 * | 4/2006 | Faure | C30B 25/18 257/49 |
| 2006/0108602 | A1 * | 5/2006 | Tanimoto | H01L 21/6835 257/192 |
| 2006/0121690 | A1 * | 6/2006 | Pogge | H01L 23/481 438/455 |
| 2006/0266280 | A1 * | 11/2006 | Francis | H01L 21/02381 117/68 |
| 2007/0002159 | A1 * | 1/2007 | Olsen | H01L 27/14621 348/335 |
| 2007/0166997 | A1 * | 7/2007 | Knorr | H01L 24/80 438/622 |
| 2008/0102554 | A1 * | 5/2008 | Abe | H01L 27/14632 438/70 |
| 2009/0020842 | A1 * | 1/2009 | Shiau | H01L 21/76898 257/459 |
| 2009/0160061 | A1 * | 6/2009 | Hsu | H01L 21/76898 257/763 |
| 2010/0090304 | A1 * | 4/2010 | Liu | H01L 21/76898 257/432 |
| 2010/0148295 | A1 | 6/2010 | Brady et al. | |
| 2011/0042814 | A1 * | 2/2011 | Okuyama | H01L 27/14634 257/758 |
| 2011/0095436 | A1 * | 4/2011 | Chen | H01L 21/76898 257/774 |
| 2012/0025389 | A1 * | 2/2012 | Chu | B81C 1/00269 257/773 |
| 2012/0098122 | A1 * | 4/2012 | Yang | B81C 1/0023 257/737 |
| 2012/0205730 | A1 * | 8/2012 | Chen | H01L 27/14609 257/292 |
| 2012/0205769 | A1 * | 8/2012 | Tsai | H01L 27/1464 257/460 |
| 2013/0134542 | A1 * | 5/2013 | Lu | H01L 27/14618 257/437 |
| 2014/0225215 | A1 * | 8/2014 | Chien | H01L 24/05 257/447 |
| 2015/0357282 | A1 * | 12/2015 | Lau | H01L 23/5226 257/401 |

OTHER PUBLICATIONS

Hofmann, Werner Hellmuth Erwin. InP-basea long-wavelength VCSELs and VCSEL arrays for high-speed optical communication. ;2009. Doktorarbeit. Technische Universitat Munchen.
Gierl, C., et al. Surface micromachined tunable 1.55 μm-VCSEL with 102 nm continuous single-mode tuning. Optics Express, 2011, 19. Jg., Nr. 18, S. 17336-17343.

\* cited by examiner

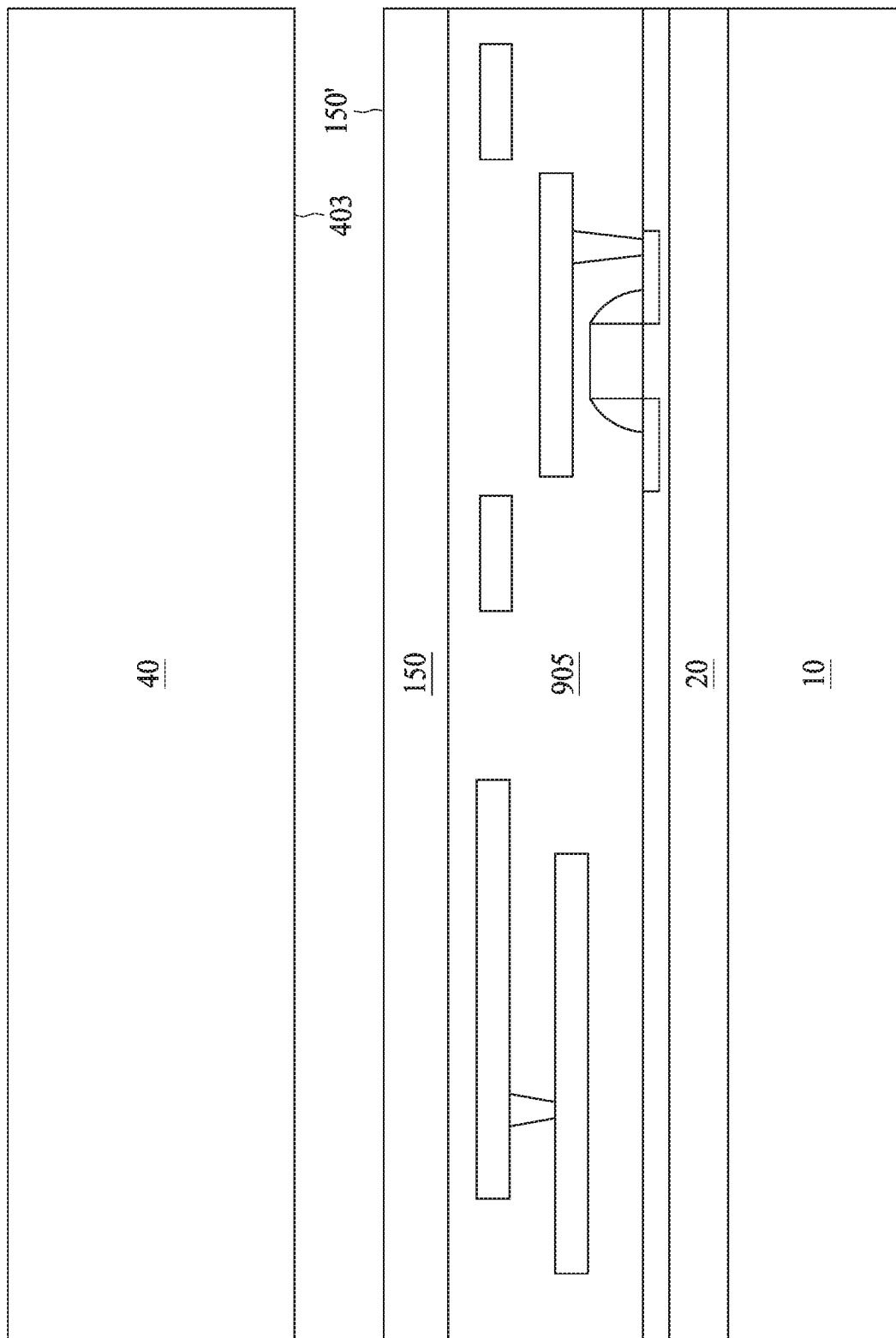

SEMICONDUCTOR STRUCTURE AND MANUFACTURING METHOD THEREOF

PRIORITY CLAIM AND CROSS REFERENCE

This application claims its priority to U.S. provisional application No. 62/273,466, filed Dec. 31, 2015.

FIELD

The present disclosure relates to a semiconductor structure with a silicon-on-insulator structure and manufacturing method thereof.

BACKGROUND

Silicon-on-insulator (SOI) structures may consist of a thick inactive base layer, typically but not necessarily made of silicon, that provides mechanical stability, an electrically insulating intermediate layer, typically but not necessarily made of silicon dioxide ($SiO_2$), and a thin top layer of high-quality single-crystalline silicon which contains microelectronic devices which have been patterned into it, e.g. by photolithographic means. There are many thick and thin film thicknesses to the appropriate geometry.

An SOI substrate, each has been found lacking in some respect. In general, certain of the methods proposed to date will produce thickness SOI wafers in relatively low yield and at relatively high cost. Other methods which have been proposed to date will produce SOI wafers having device layers which have an unacceptable variation or which contain defects.

Although various approaches have been proposed for fabricating SOI wafers with defect-free device layers having relatively low variation, but these methods typically produce SOI wafers in relatively high yield and at a favorable cost, but these methods typically produce thickness variation or which contains defects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 13 to FIG. 20 show schematic cross-sectional views of a semiconductor structure and depict the sequence of operations for fabrication the semiconductor structure, according to some embodiments of the present disclosure.

DETAILED DESCRIPTION OF THE INVENTION

Figure 1:
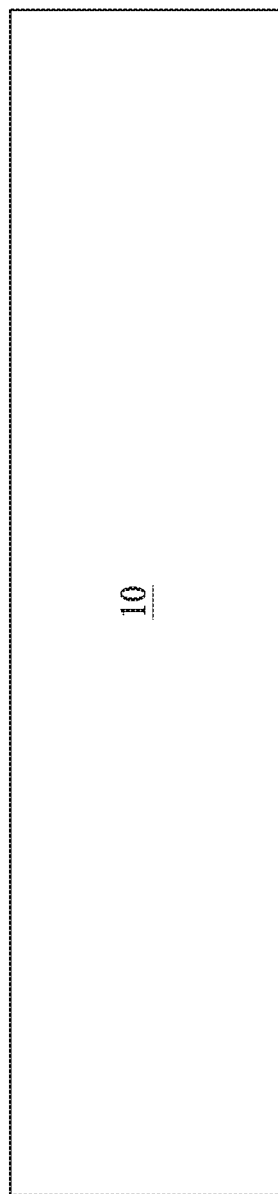
FIG. 1 to FIG. 5 show schematic cross-sectional views of a semiconductor structure and depict the sequence of operations for fabrication the semiconductor structure, according to some embodiments of the present disclosure.

In the drawings, like reference numbers are used to designate like or similar elements throughout the various views and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Conventionally, an example of an etch stop for achieving thickness of 500 nm or less has been providing a heavily doped boron region placed by diffusion or implantation into the silicon. Most of the silicon substrate underlying the boron doped etch stop region is removed by grinding and polishing and a remainder portion thereof is selectively etched using an etchant consisting of ethylene diamine and pyrocatechol. With this etchant, nominal selectivity ratios of 100:1 are reported for etch rates of undoped silicon compared to the etch rate of the very heavily doped boron etch stop region. A second trimming may be further provided to fine tuning the roughness of the etched surface. The second trimming may be used to remove a thin layer of the silicon film since the heavily doped etch stop layer has been substantially consumed. For example, a planarization operation is performed after the etching, and then another etchant with a slower etching rate compared to the aforesaid etchant is applied to the rough surface in order to achieve desired surface roughness.

A disadvantage of using a heavily doped boron region however is that boron is a p-type dopant in silicon. Additionally, both implantation and diffusion of boron results in residual p-type doping of the silicon film. For example, when undergo thermal processes, the boron atoms in the heavily doped boron region interdiffuse into the overlying silicon film, causing a nonuniform boron doping distribution at the interface between the heavily-doped etch stop layer and the silicon. As a result, the selective etchant inevitably removes a portion of silicon film interfacing with the heavily-doped etch stop layer and generate excessive surface roughness. The second trimming discussed above cannot alleviate said large surface roughness. Hence, total thickness variation (TTV) of the silicon film in contact with the selective etchant is therefore large.

Still further, boron incorporated by ion implantation and annealing results in the generation of threading dislocations in the device region. Performance of devices made from these substrates which is neither thin nor uniform across the entire silicon wafer.

The present disclosure provides a semiconductor structure having a thinned substrate in at least one of the semiconductor devices. Instead of adopting a heavily-doped etch stop layer for control the removal operation, an undoped III-V etch stop layer is provided in contact with the silicon film where active elements are to be manufactured. In some embodiments, the semiconductor structure includes a first semiconductor device having a first surface and a second surface, the second surface being opposite to the first surface, a semiconductor substrate over the first surface of the first semiconductor device, and a III-V etch stop layer in contact with the second surface of the first semiconductor device.

The present disclosure provides a silicon-on-insulator (SOI) structure having an undoped III-V etch stop layer as the insulator layer. Due to the high selectivity between silicon and III-V materials (or even the unintentionally doped III-V materials), a TTV of less than about 1 nm at the etched surface can be achieved, as opposed to a TTV of 0.15 µm in current back side complementary metal oxide semiconductor image sensor application and a TTV of 1 µm in current wafer-on-wafer stacking operation.

The present disclosure also provides manufacturing methods of a semiconductor structure described herein. The method includes providing a temporary substrate having a first surface, forming a III-V etch stop layer over the first surface, forming a first semiconductor device over the III-V etch stop layer, and removing the temporary substrate by an etching operation and exposing a surface of the III-V etch stop layer.

Referring to FIGS. 1-5, FIG. 1 to FIG. 5 show schematic cross-sectional views of a semiconductor structure with a thinned substrate and depict the sequence of operations for fabrication the semiconductor structure, according to some embodiments of the present disclosure. In FIG. 1, a primary substrate 10 is provided. Primary substrate 10 can comprise, for example, a P– or an N–, 5 inch diameter silicon substrate. Such a commercially available substrate is of a desired thickness uniformity tolerance of 10 to 20 µm. In other words, the thickness non-uniformity of 10 to 20 µm. In some embodiments, the primary substrate may be over 700 µm thick. In some embodiments, since the primary substrate 10 is to be thinned to less than about 5 µm in the subsequent operations, the primary substrate 10 is called a temporary substrate in the present disclosure. In some embodiments, the primary substrate 10 is a P+ wafer, having a boron concentration of between about 1E18 and about 5E20 boron atoms/cm$^3$, preferably between about 1E18 and about 3E20 boron atoms/cm$^3$, a resistivity of about 0.01 to about 0.02 ohm-cm, preferably a resistivity of about 0.01 to about 0.015 ohm-cm, a thickness of about 300 µm to 800 µm and a diameter which may be, for example, 100, 125, 150, 200 mm or more.

Figure 2:
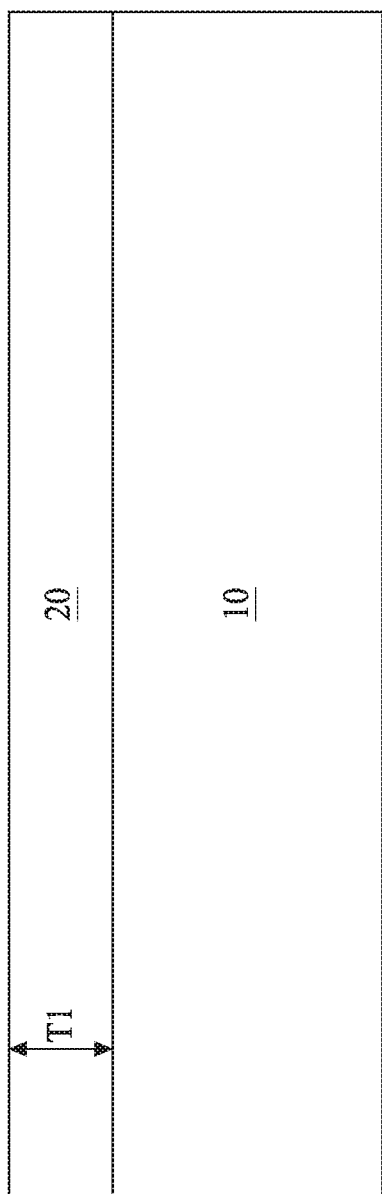

In FIG. 2, a III-V etch stop layer 20 is formed over the primary substrate 10. The etch stop layer 20 comprises an abrupt, well-defined, etch stop which is epitaxial grown by low temperature techniques known in the art, such as, gas source molecular beam epitaxy (MBE), ultra high vacuum chemical vapor deposition (UHVCVD), or low temperature atmospheric pressure (AP) CVD, or other vapor depositions. Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using electrochemical reaction include electroplating, electro-less plating, and the like. Other examples of deposition include pulse laser deposition (PLD), and atomic layer deposition (ALD).

In some embodiments, the III-V etch stop layer 20 comprises III-V materials with similar lattice constant as the materials made of the primary substrate 10. For example, if the primary substrate 10 is composed of silicon, the III-V etch stop layer 20 can be composed of gallium phosphide (GaP) since the lattice mismatch between Si and GaP is 0.36%. In some embodiments, a GaP layer of about 40 nm can be deposited over a p+ silicon substrate with a RMS surface roughness of 0.5 nm. As shown in FIG. 2, the III-V etch stop layer 20 is deposited to have a thickens T1 of less than 40 nm. The thickens T1 of the III-V etch stop layer 20 can be determined based on a critical thickness of the deposited materials with respect to the underlying template materials. In other words, the thickness T1 shall not exceed the critical thickness of the deposited materials. For example, when the primary substrate 10 is composed of silicon, and the III-V etch stop layer 20 is composed of GaP, the thickens T1 of the III-V etch stop layer 20 may be determined to be less than 40 nm. In some embodiments, the III-V etch stop layer 20 is grown undoped. However, subsequent thermal operation may cause an unintentionally doped profile in proximity to the surface of the etch stop layer 20 interfacing with adjacent doped layer.

Figure 3:
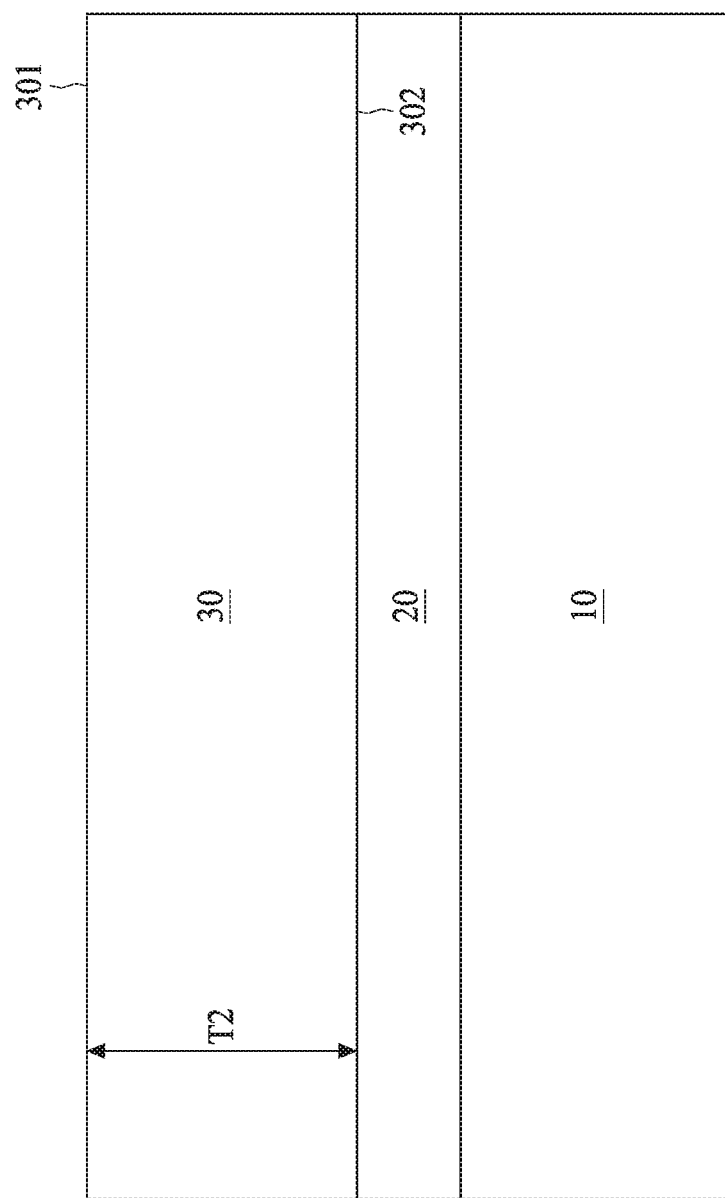

In FIG. 3, a device layer 30 is formed over the etch stop layer 20. In some embodiments, the device layer 30 is epitaxially grown and followed by various operations to form, for example, active regions or sensing region of a first semiconductor device. The thickness T2 of the device layer 30 is preferably about 1.5 µm to 5 µm thick and of a conductivity type and resistivity type (e.g., n or p-) to allow the use of preferential etchants as described herein. Device layer 30 is formed over the III-V etch stop layer 20 by epitaxial techniques known in the art, such as, gas source molecular beam epitaxy ("MBE"), ultra high vacuum chemical vapor deposition ("UHCVD"), or atmospheric pressure chemical vapor deposition ("APCVD"). Standard pre-epitaxial cleaning steps such as high temperature (e.g., at least about 900° C.) hydrogen pre-bakes may optionally be employed. In addition, an oxide layer may optionally be formed on device layer 30. As shown in FIG. 3, the device layer 30 includes a first surface 301 and a second surface 302. In the current operation, the second surface 302 of the device layer 30 is in contact with the III-V etch stop layer 20.

In some embodiments, the first semiconductor device may include a photo sensing region when the first semiconductor device is a CMOS image sensor. In other embodiments, the first semiconductor device may include at least a logic structure with a transistor region and metallization layers.

Figure 4:
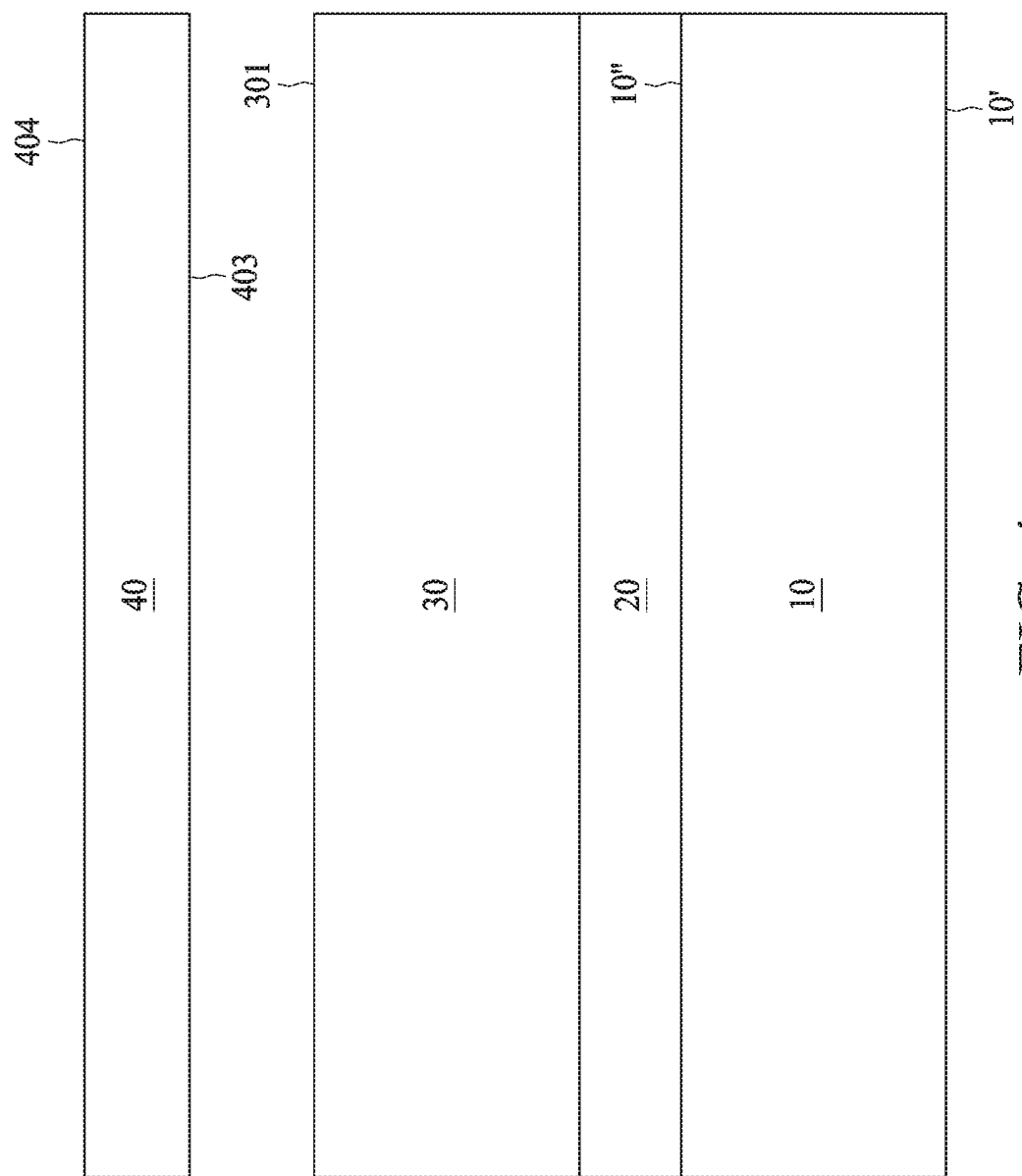

In FIG. 4, a semiconductor substrate 40 is separately prepared and a third surface 403 of the semiconductor substrate 40 is bonded to the first surface 301 of the device layer 30. The semiconductor substrate 40 includes a fourth surface 404 opposite to the third surface 403. In some embodiments, the fourth surface 404 is a backside of the semiconductor substrate 40. In some embodiments, the third surface 403 of the semiconductor substrate 40 may include other layers such as a dielectric layer or a hybrid layer including a dielectric materials and metal traces. Similarly, the first surface 301 of the device layer 30 may include layers other than epitaxy layers such as dielectric layer or a hybrid layer including a dielectric materials and metal traces in facilitating, for example, bonding operations.

In some embodiments, the semiconductor substrate 40 may be a carrier substrate possessing sufficient mechanical strength for subsequent processing. Semiconductor substrate 40 may comprise an original silicon substrate, similar to primary substrate 10, for example, a P- or an N-silicon substrate, having a diameter which corresponds to the diameter of the device layer 30 and a desired thickness uniformity tolerance of 10 to 20 μm. In some embodiments, because the semiconductor substrate 40 merely serves as a means for handling the primary substrate 10 and the epitaxy layers thereon, the conductivity type and resistivity type of semiconductor substrate 40 is not critical. Advantageously, therefore, semiconductor substrate 40 may be formed from very low cost silicon.

Figure 5:
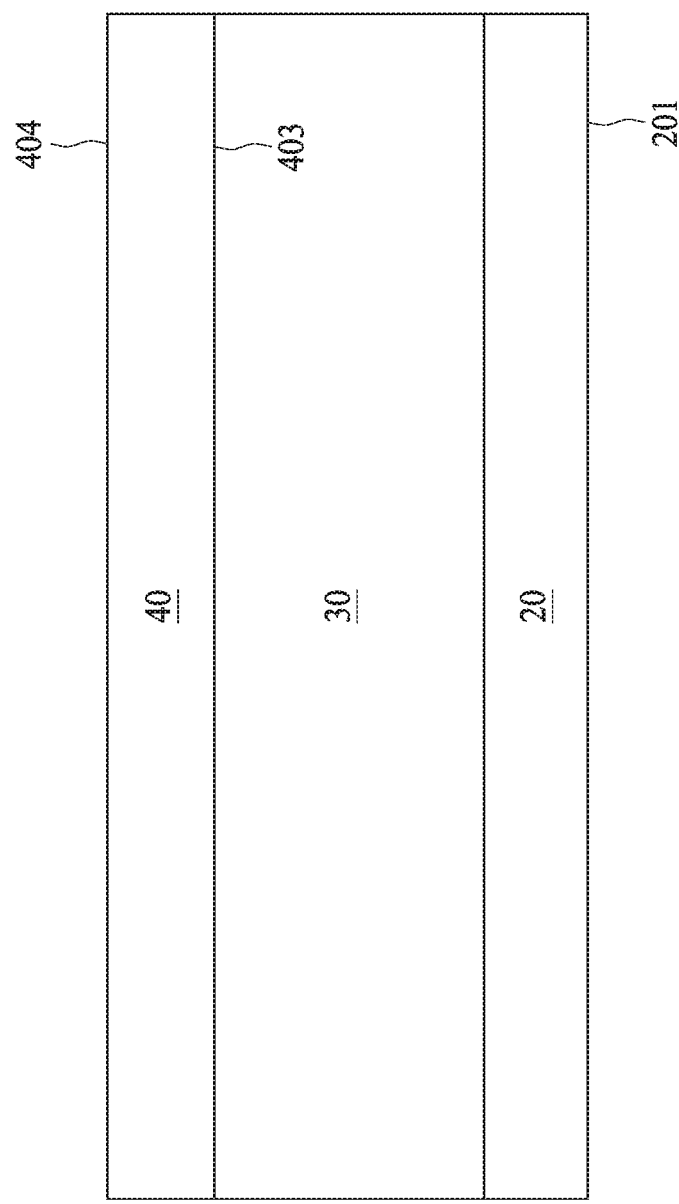

Referring to FIG. 5, the semiconductor substrate 40 and the device layer 30 over the primary substrate 10 is bonded together while the primary substrate 10 is removed subsequently, exposing a surface 201 of the etch stop layer 20. Wafer bonding is well known in the art and only briefly discussed herein. Semiconductor substrate 40 preferably comprises silicon substrate, as previously discussed, and further having an oxide layer formed on a top surface of silicon substrate. A dielectric layer or a metallization layer formed over the device layer 30 is placed in contact with semiconductor substrate 40 such that dielectric layer or a metallization layer of the device layer 30 is in intimate contact with oxide layer over the semiconductor substrate 40. Primary substrate 10 and semiconductor substrate 40 are then subjected to a heat treatment for a predetermined period of time until the oxide layer and the dielectric layer or the metallization layer is bonded together. The temperatures can be around 700° C. to about 800° C. The resultant TTV of the bonded wafer pair, comprising primary wafer 10 and semiconductor substrate 40, is the sum of the individual TTVs of primary substrate 10 and semiconductor substrate 40.

Subsequent to bonding the primary substrate 10 to the semiconductor substrate 40, the primary substrate 10 is removed. Removal of primary substrate 10 is accomplished in preferably two steps, that is, grinding approximately 80 to 90 percent of the primary substrate 10 and thereafter selectively etching a remaining portion of the primary substrate 10. Compared to conventional sequence of grinding, lapping, wet etching, and/or chemical mechanical polishing to substantially reduce the thickness of the primary substrate 10, the present disclosure provides that removal of a substantial portion of primary substrate 10 can be accomplished by subjecting the structure to a only a grinding and a wet etching operation. Due to a high selectivity between the primary substrate 10 and the etch stop layer 20, an abrupt III-V etch stop layer 20 can be exposed after the wet etching operation.

The grinding operation of the present disclosure can include a coarse grinding and a fine grinding. The backside 10' of the primary substrate 10 shown in FIG. 4 is grounded with a conventional grinder using a relatively coarse grinding wheel such as a D46 grind wheel or a 320 grit grind wheel to thin the primary substrate 10. In this coarse grinding step, a substantial portion, but not the entire thickness of the primary substrate 10 is removed. The amount of material removed in this coarse grinding step is determined, in part, by the total roughness of the silicon surface after the coarse grinding and the additional process steps which will be required to eliminate the roughness and damage created during the coarse grinding step. Preferably, the average surface roughness after the coarse grinding step is less than about 0.5 μm, more preferably less than about 0.3 μm, and the total surface roughness after the coarse grinding step is less than about 5 μm, more preferably less than 3 μm. The average roughness, and the total surface roughness for a coarse ground surface may be determined using a profilometer with the average roughness, being measured over a one square-centimeter area.

To remove the roughness and damage created in the coarse grinding step, the surface of the device wafer is preferably subjected to a second grinding step, i.e., the fine grinding step. For fine grinding, a 1200 mesh finish grinding wheel may be used. The amount of material removed in the fine grinding step is at least about three times, preferably at least about five times the total surface roughness value of the silicon surface after the coarse grinding step. Fine grinding, however, imparts its own roughness and damage to the silicon surface and typically, the silicon surface after the fine grinding step will have an average surface roughness of less than 0.1 μm, more preferably less than about 0.02 μm, and a total surface roughness of less than about 0.75 μm. The average roughness and the total surface roughness, RT, for a fine ground surface may be determined using a profilometer which is capable of measuring roughness values of a nanometer or less, with the average roughness being measured over a one square-centimeter area.

The thinned primary substrate 10, after grinding, has an exposed surface and a thickness of about 20 to about 35 micrometers, more preferably, about 25 to about 30 micrometers. In addition, the grinding process should be controlled to minimize the TTV across the ground wafer. For a 200 millimeter diameter wafer, for example, the TTV should be less than 2 micrometers, more preferably less than 0.8 micrometers and even more preferably no more than about 0.5 micrometers.

Although the remaining thickness of the primary substrate 10 may be removed by selective etching, the selective etchants remove silicon at a relatively slow rate. To improve throughput, therefore, it is preferred that the bulk of the primary substrate 10 be mechanically removed by grinding and that roughness and damage created in the grinding process be removed prior to wet etching. The wet chemical etchant of the present disclosure may include at least one of the following etching chemistries, $HF:HNO_3:CH_3COOH$ (HNA) and Tetramethylammonium hydroxide (TMAH).

Etchant comprising hydrofluoric acid, nitric acid, and acetic acid in the ratio of 3:5:3 parts by weight ($HF:HNO_3:CH_3COOH$) which is commonly referred to as HNA. Under a condition where a P+ silicon substrate and an overlaid, lightly doped P epitaxial layer is acquired, after the formation of the etch stop layer 20 and the device layer 30 over front side 10" of the primary substrate 10, the HNA etches P+ silicon from the backside 10' of the primary substrate 10 at a rate of about 80 micrometers per minute at a temperature of about 20° C. to about 30° C. and having a selectivity of 100 between P+ silicon layer and P epitaxial silicon layer. Alternatively stated, HNA removes P+ silicon layer 100 times faster than it does on P epitaxial silicon layer. The remaining portion of the primary substrate 10 may then be removed by smooth grinding, polishing or a combination of smooth grinding and polishing as described above. Tetramethylammonium hydroxide (TMAH) can be utilized for smooth grinding at a rate of about 0.2 micrometers per minute to fine tune the thickness of the lightly doped P epitaxial silicon layer. Alternatively, TMAH can be utilized to remove both the Pi-silicon layer and P epitaxial silicon layer at the expense of a longer etching time after the coarse and fine grinding operation. More detail description regarding this wet etching operation can refer to FIG. 6 to FIG. 12.

Under a condition where a P+ or P− silicon substrate is acquired, after the formation of the etch stop layer 20 and the device layer 30 over front side 10" of the primary substrate 10, TMAH etches P+ or P− silicon substrate from the backside 10' of the primary substrate 10 at a rate about 0.2 micrometers per minute after the coarse and fine grinding operations.

No matter using HNA for a fast first etch and followed by TMAH for a fine tuning, or using TMAH only to achieve the desired thickness reduction, the wet etching operation is stopped at the III-V etch stop layer 20 because the selectivity between silicon and III-V material with respect to a basic etchant such as TMAH is nearly infinity. In connection to this fact, other basic etchants which etches silicon may be used to replace TMAH and are therefore enclosed in the contemplated scope of the present disclosure.

Figure 6:
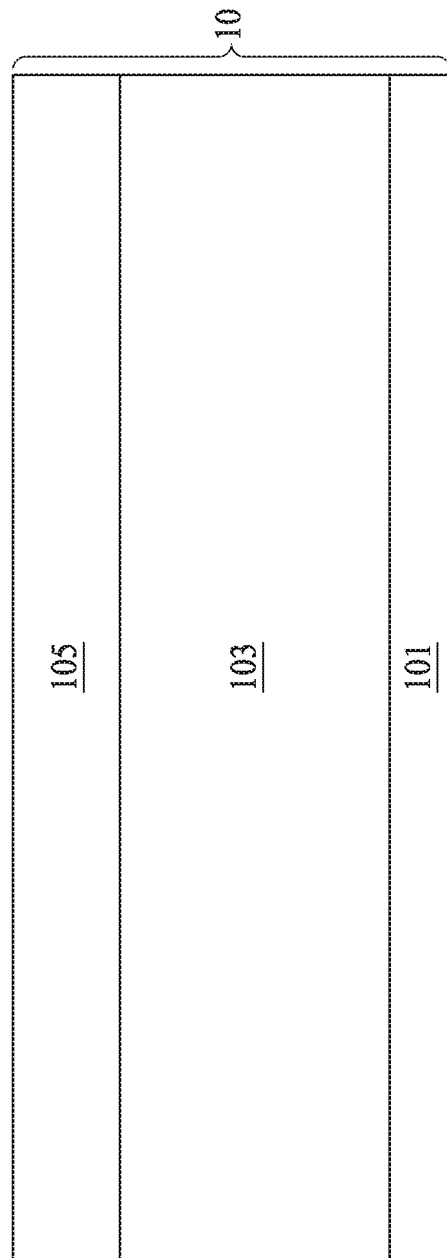
FIG. 6 to FIG. 12 show schematic cross-sectional views of a semiconductor structure and depict the sequence of operations for fabrication the semiconductor structure, according to some embodiments of the present disclosure.
Figure 7:
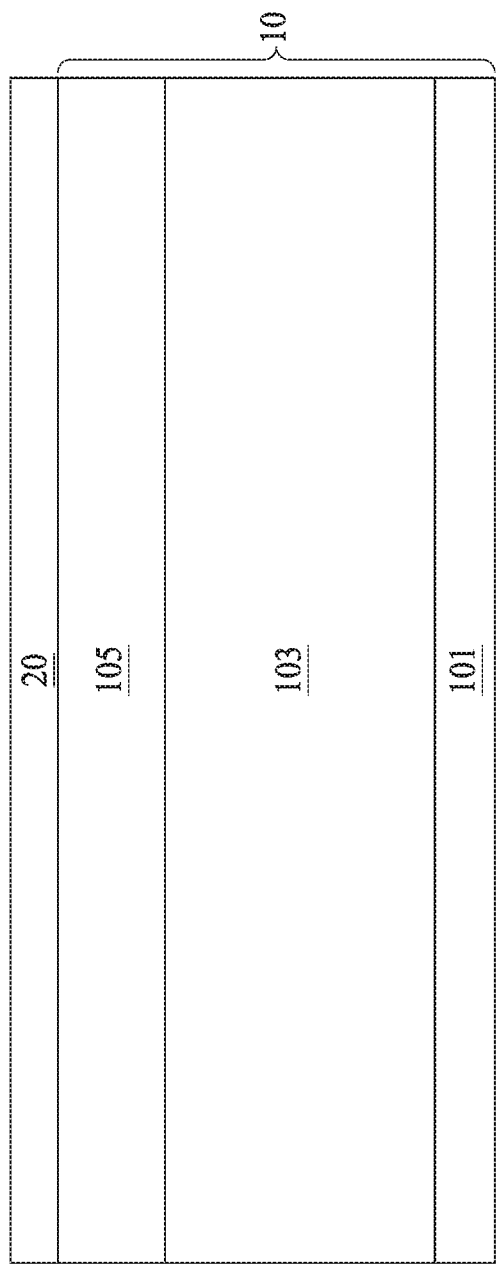

FIG. 6 to FIG. 12 show schematic cross-sectional views of a semiconductor structure 100 (see FIG. 12) and depict the sequence of operations for fabrication the semiconductor structure 100, according to some embodiments of the present disclosure. Numeral labels identical to those in FIG. 1 to FIG. 5 refer to identical elements or equivalents and are not repeatedly introduced. In FIG. 6, the primary substrate 10 is provided in a form of a trilayer including a low temperature oxide layer 101, a P+ silicon layer 103, and a P− silicon epitaxy layer 105. In some embodiments, the primary substrate 10 of FIG. 6 is commercially acquired. Referring to FIG. 7, a III-V etch stop layer 20 is deposited over the P− silicon epitaxy layer 105. In some embodiments, the III-V etch stop layer 20 is composed of undoped GaP and thus is substantially an insulator. Details of the formation and the dimensions of the GaP over the silicon epitaxy layer 105 are previously discussed with respect to FIG. 2 and can be referred thereto.

Figure 8:
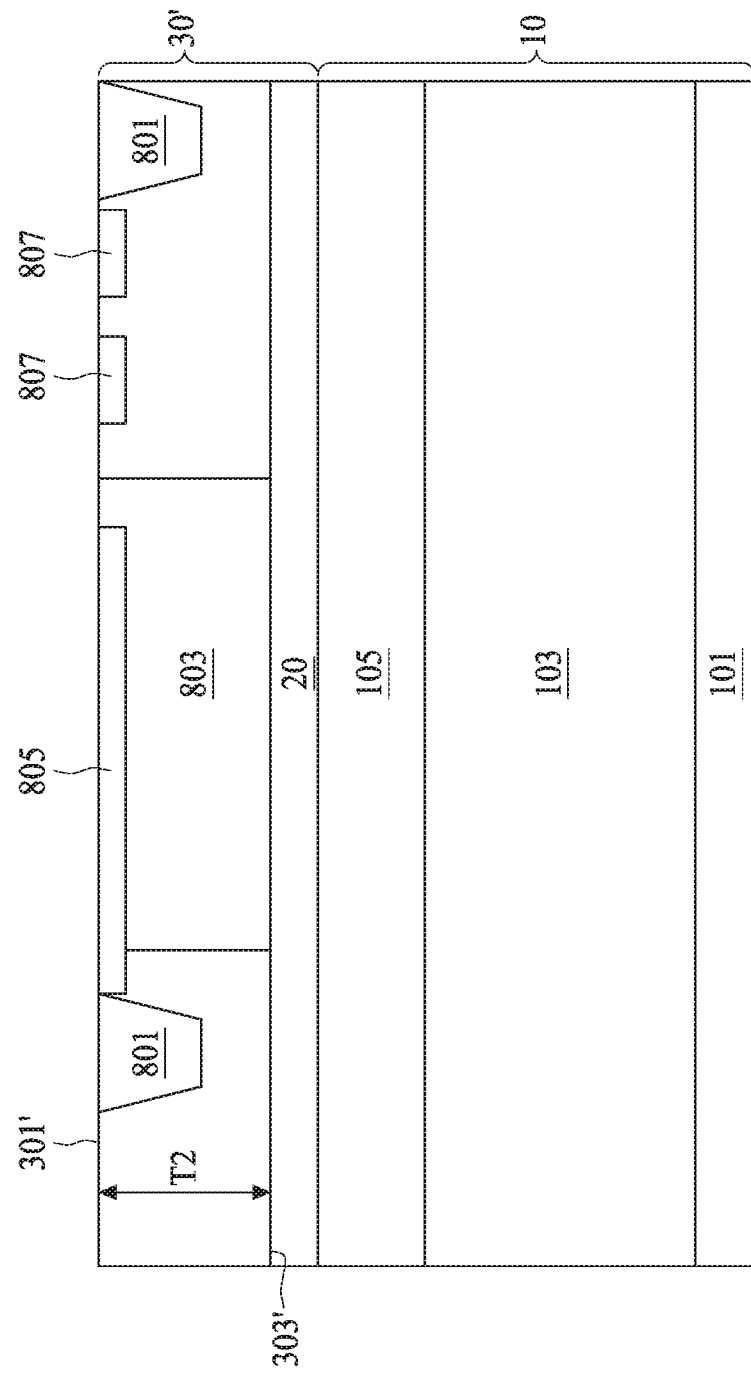

Referring to FIG. 8, a portion of the device layer 30' is formed over the III-V etch stop layer 20. When the portion of the device layer 30' is composed of silicon, a silicon-insulator-silicon structure is formed as depicted in FIG. 8. Note the lattice constant difference between the silicon epitaxy layer 105, the III-V etch stop layer 20, and the portion of the device layer 30' are negligible thereby lattice strain can be avoided.

Note the portion of the device layer 30' includes a front surface 301' and a back surface 303'. The portion of the device layer 30' has a thickness, T2, defined between the front surface 301' and the back surface 303'. In an example, the thickness, T2, of the portion of the device layer 30' is about 1.5 μm to about 5 μm. The portion of the device layer 30' includes various features disposed at the front surface 301'. For example, the portion of the device layer 30' includes isolation features 801 isolating a sensing region 803 from adjacent sensor elements. For example, the portion of the device layer 30' includes a light-sensing region (or photo-sensing region), a pinned layer 805, and various transistors, such as a transfer transistor associated with a transfer gate 807 and a reset transistor associated with a reset gate 901 as shown in FIG. 9.

Figure 9:
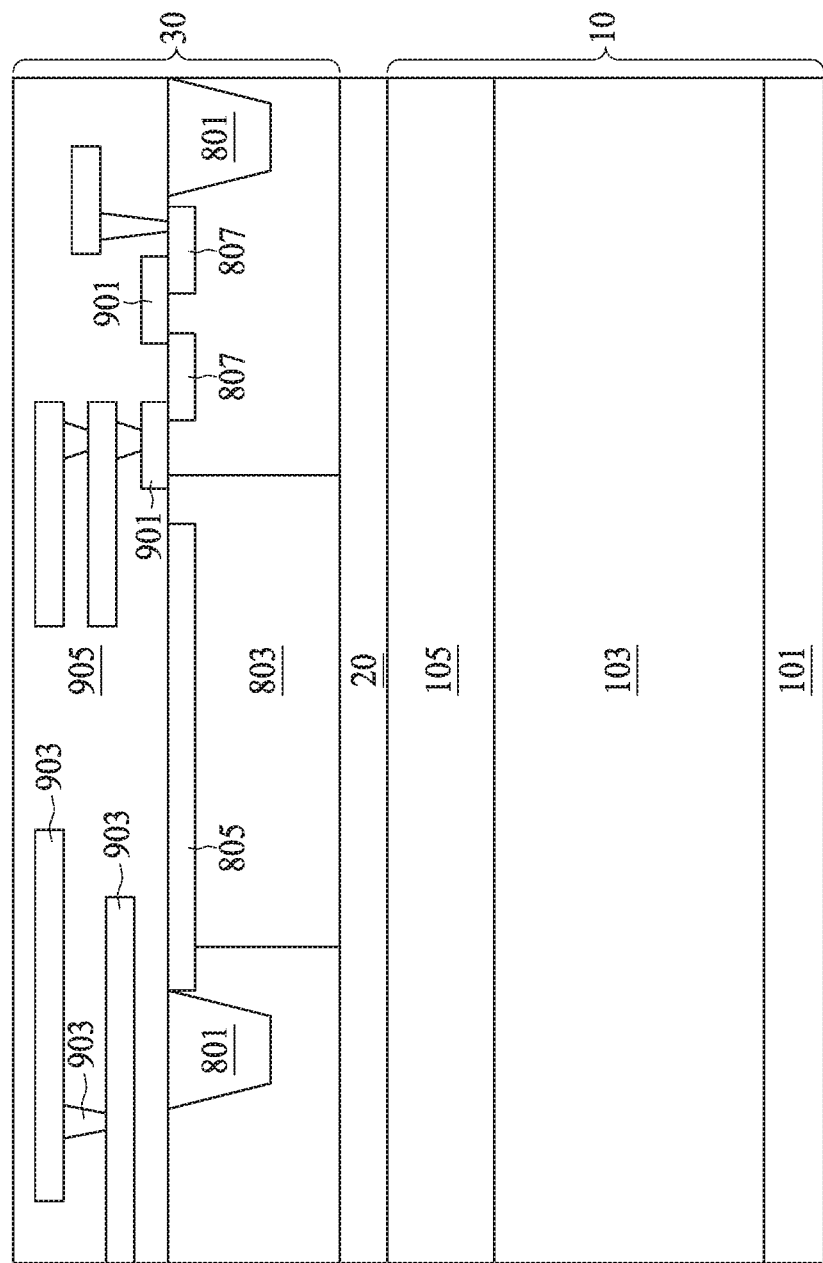

Referring to FIG. 9, the device layer 30 further includes a multilayer interconnect (MLI) 903 disposed over the portion of the device layer 30', including over the sensing region 801. The MLI 903 is coupled to various components of the BSI image sensor device, such as the sensing region 801, such that the various components of the BSI image sensor device are operable to properly respond to illuminated light (imaging radiation). The MLI 903 includes various conductive features, which may be vertical interconnects, such as contacts and/or vias, and/or horizontal interconnects, such as conductive lines. The various conductive features include conductive materials, such as metal. In an example, metals including aluminum, aluminum/silicon/copper alloy, titanium, titanium nitride, tungsten, polysilicon, metal silicide, or combinations thereof, may be used, and the various conductive features may be referred to as aluminum interconnects. Aluminum interconnects may be formed by a process including physical vapor deposition (PVD), chemical vapor deposition (CVD), or combinations thereof. Other manufacturing techniques to form the various conductive features may include photolithography processing and etching to pattern conductive materials to form the vertical and horizontal connects. Still other manufacturing processes may be implemented to form the MLI 903, such as a thermal annealing to form metal silicide. The metal silicide used in multilayer interconnects may include nickel silicide, cobalt silicide, tungsten silicide, tantalum silicide, titanium silicide, platinum silicide, erbium silicide, palladium silicide, or combinations thereof. Alternatively, the various conductive features may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. The MLI 903 is not limited by the number, material, size, and/or dimension of the conductive features depicted, and thus, the MLI 903 may include any number, material, size, and/or dimension of conductive features depending on design requirements of the device layer 30.

The various conductive features of the MLI 903 are disposed in an interlayer (or inter-level) dielectric (ILD) layer 905. The ILD layer 905 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SILK Dow Chemical, Midland, Mich.), polyimide, other suitable material, or combinations thereof. The ILD layer 905 may have a multilayer structure. The ILD layer 905 may be formed by a technique including spin-on coating, CVD, sputtering, or other suitable process. In an example, the MU 903 and ILD layer 905 may be formed in an integrated process including a damascene process, such as a dual damascene process or single damascene process.

Figure 10:
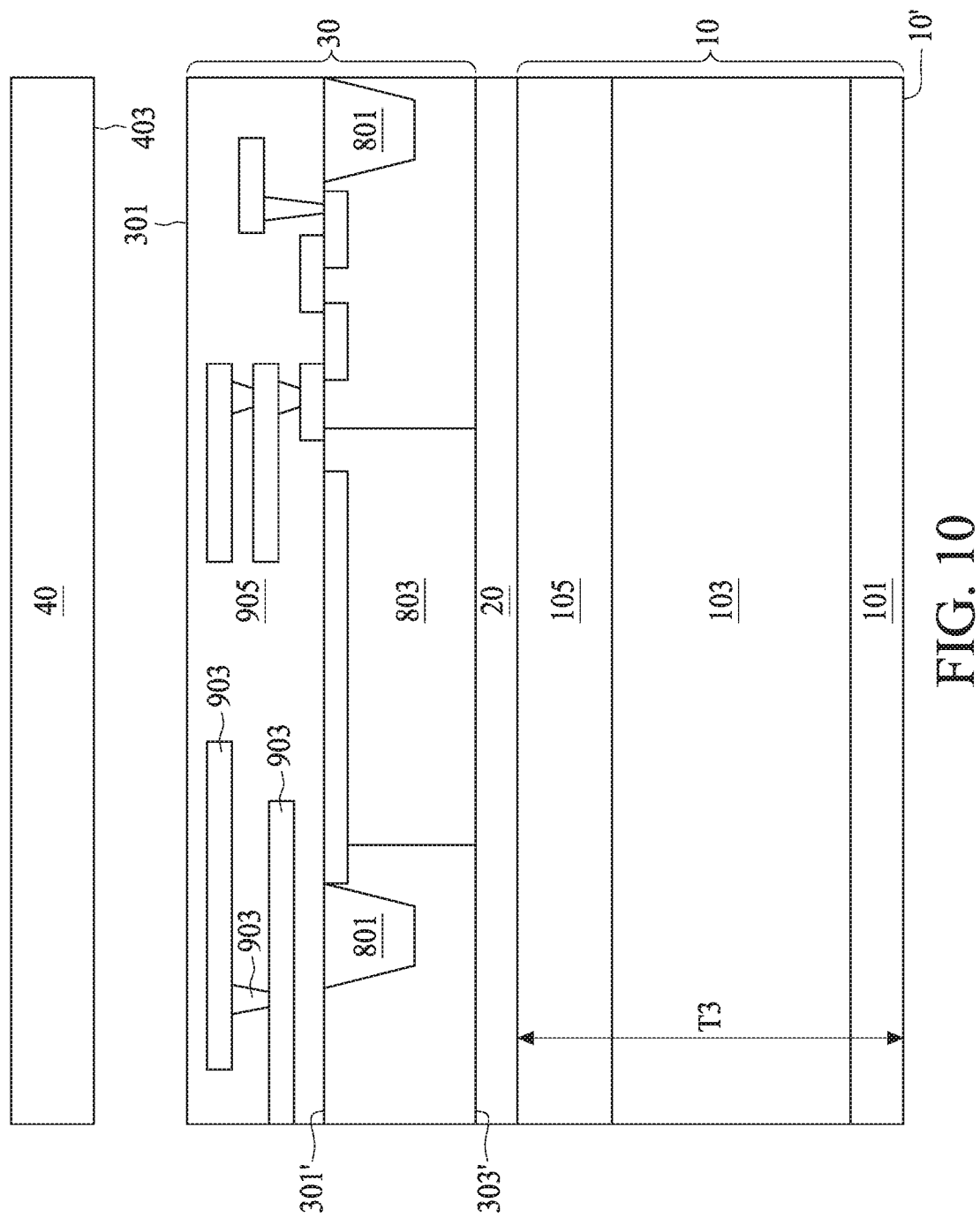

Referring to FIG. 10, a semiconductor substrate 40 is separately prepared and disposed over the front surface 301 of the device layer 30. In the depicted embodiment, the semiconductor substrate 40 is bonded to the ILD layer 905. The semiconductor substrate 40 can be a carrier wafer including silicon. Alternatively, the semiconductor substrate 40 includes another suitable material, such as glass. The semiconductor substrate 40 can provide protection for the various features (such as the sensing region 803) formed on the front surface 301' of the portion of the device layer 30' and can also provide mechanical strength and support for processing the back surface 303' of the portion of the device layer 30'.

Figure 11:
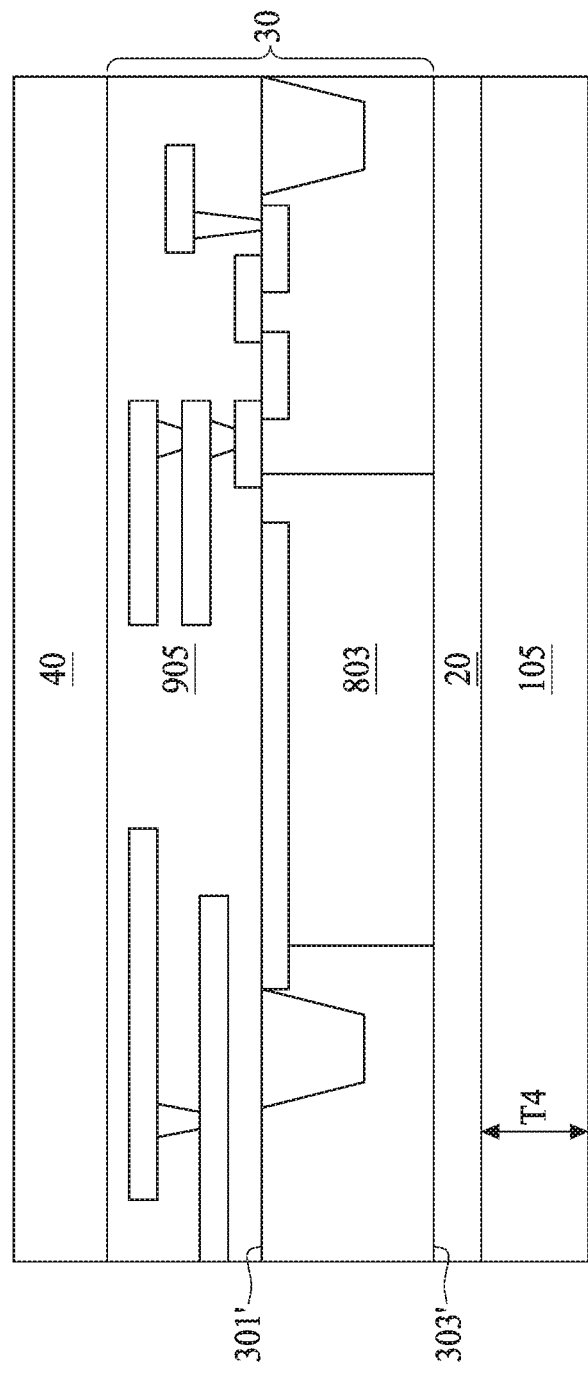

Referring to FIG. 11, after the semiconductor substrate 40 is bonded to the device layer 30, the primary substrate 10 is thinned down from the backside 10' thereof. A substrate thickness reduction process (also referred to as a thinning process) is performed to reduce a thickness of the primary substrate 10 from about a thickness T3 (e.g., 775 μm) to about a thickens T4 (e.g., 5 μm). In an example, the substrate thickness reduction process is performed at the backside 10' of the primary substrate 10 until the lightly doped P epitaxy layer 105 is reached. In some embodiments, a coarse grinding and a fine grinding are applied to the primary substrate 10, followed by an HNA etch until the etchant, reaches the P+/P interface (103, 105). A TMAH etch is then applied to fine tune the lightly doped P epitaxy layer 105 under the etchant reaches the III-V etch stop layer 20. Alternatively, A TMAH etch is applied right after the coarse grinding and a fine grinding until the exposure of the III-V etch stop layer 20. Details regarding the coarse grinding, the fine grinding, the HNA etch and TMAH etch are previously described in FIG. 5 and can be referred thereto. The primary substrate 10 thickness reduction operation may implement a multi-step process, for example, a multi-step process that includes grinding, polishing, and etching (dry etching, wet etching, or a combination thereof). For example, a polishing operation including a chemical mechanical polishing may be optionally implemented after the HNA etch and before the TMAH etch.

Figure 12:
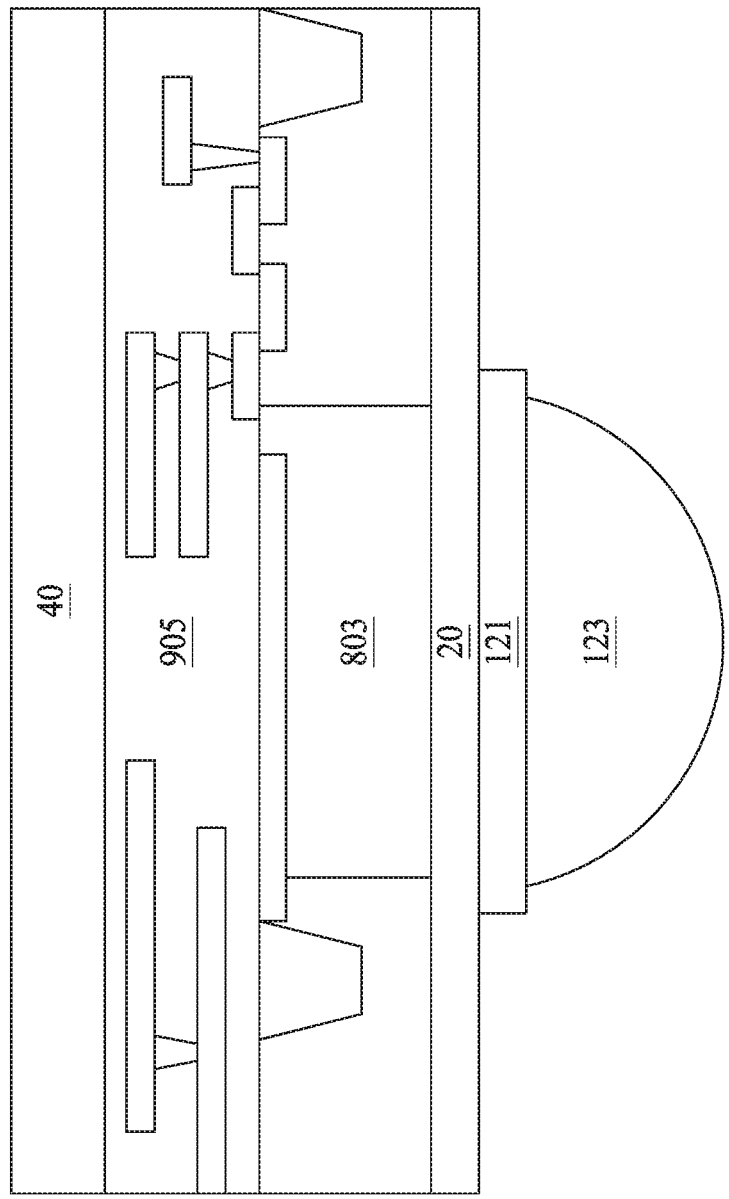

Referring to FIG. 12, a semiconductor structure 100, such as a backside image sensor, is formed. The semiconductor structure 100 further includes features disposed over the backside 303' of the device layer 30. For example, the III-V etch stop layer 20 can be used as an antireflective layer, a color filter 121, and a lens 123 are disposed over the backside 303' of the device layer 30. In the depicted embodiment, the III-V etch stop layer 20 is disposed between the backside 303' of the device layer 30 and the color filter 121. In some embodiments, the etch stop layer 20 includes GaP, which possesses a greater refractive index (RI) than the silicon within a wavelength range of from 400 nm to 700 nm. Greater RI allows more incident light to be collected into the sensing region 803 and therefore GaP can functions as an antireflective layer in a silicon-based backside image sensor.

The color filter 121 is disposed over the backside 303' of the device layer 30, and is aligned with the light-sensing region 803. The color filter 121 is designed so that it filters through light of a predetermined wavelength. For example, the color filter 121 may filter through visible light of a red wavelength, a green wavelength, or a blue wavelength to the sensing region 803. The color filter 121 includes any suitable material. In an example, the color filter 121 includes a dye-based (or pigment-based) polymer for filtering out a specific frequency band (for example, a desired wavelength of light). Alternatively, the color filter 121 includes a resin or other organic-based material having color pigments.

The lens 123, disposed over the backside 303' of the device layer 30, particularly over the color filter 121, and is also aligned with the light-sensing region 803. The lens 123 may be in various positional arrangements with the sensing region 803 and color filter 121, such that the lens 123 focuses the incident radiation on the sensing region 803. The lens 123 includes a suitable material, and may have a variety of shapes and sizes depending on an index of refraction of the material used for the lens and/or a distance between the lens and sensing region 803. Alternatively, the position of the color filter layer 121 and lens layer 123 may be reversed, such that the lens 123 is disposed between the antireflective layer and color filter 121.

Figure 13:
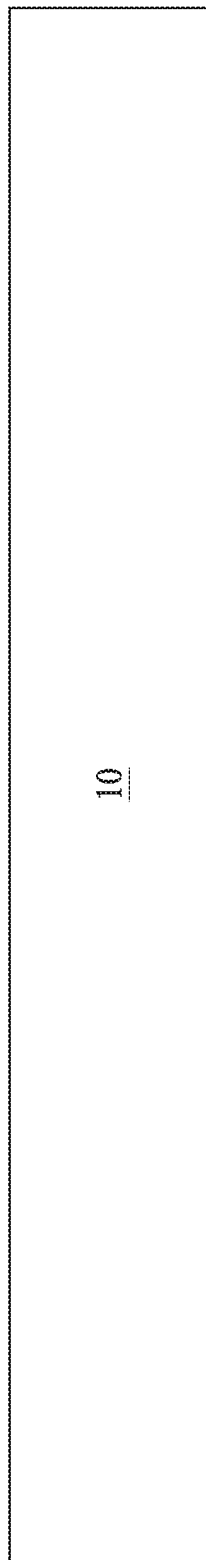
Figure 14:
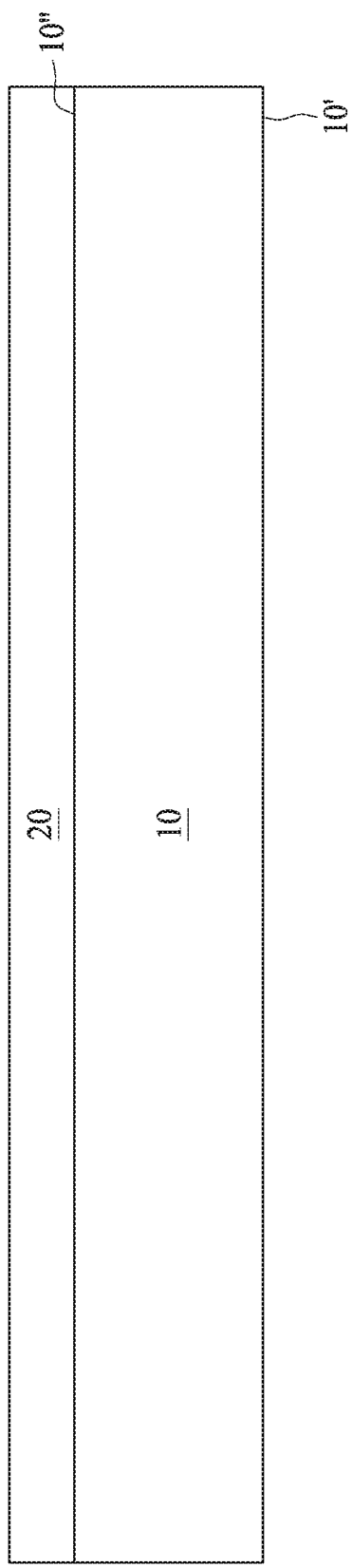

FIG. 13 to FIG. 20 show schematic cross-sectional views of a semiconductor structure 200 (see FIG. 20) and depict the sequence of operations for fabrication the semiconductor structure 200, according to some embodiments of the present disclosure. Numeral labels identical to those in FIG. 1 to FIG. 5 refer to identical elements or equivalents and are not repeatedly introduced. In FIG. 13, the primary substrate 10 acquired can be either a P+ or a P− silicon substrate. In FIG. 14, III-V etch stop layer 20 is formed over a front side 10'' of the primary substrate 10. The formation of the III-V etch stop layer 20 is previously discussed with respect to FIG. 2 and can be referred thereto.

Figure 15:
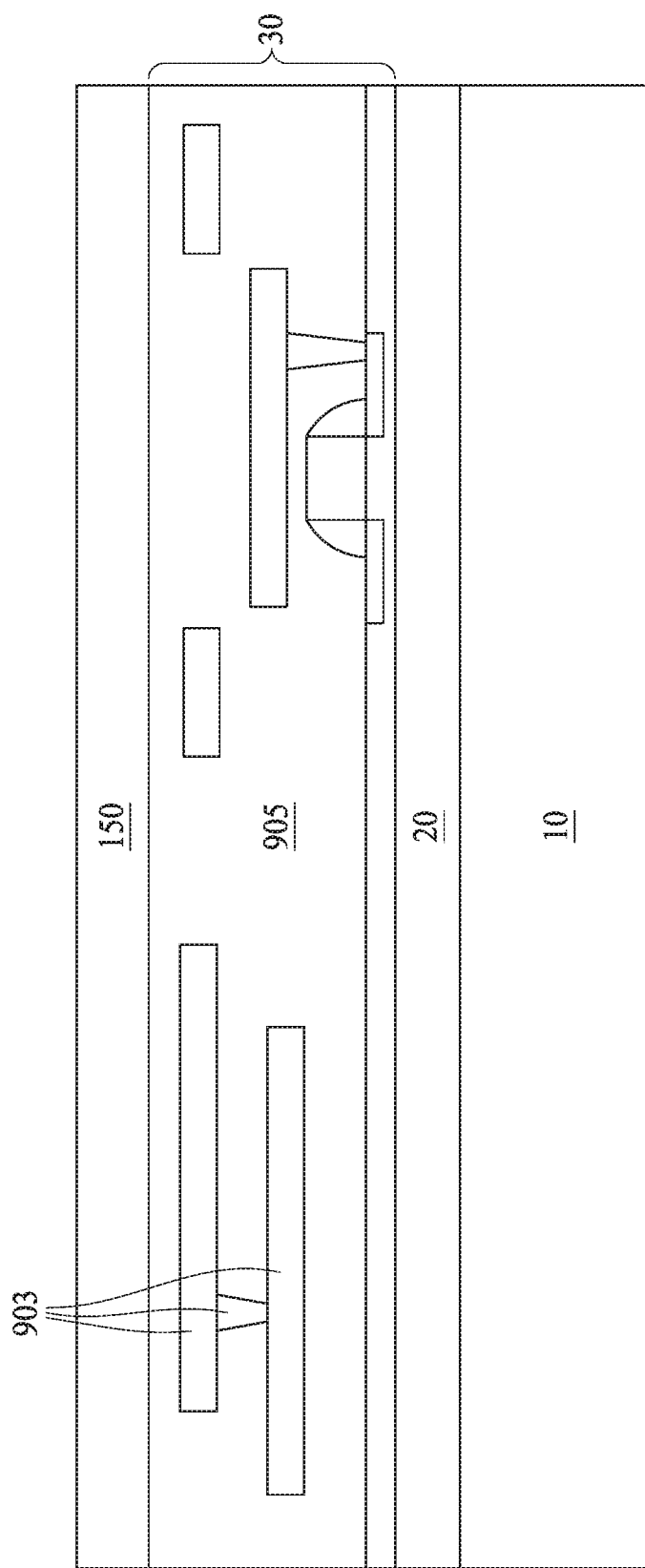

In FIG. 15, a device layer 30 is formed over the III-V etch stop layer 20. The device layer can include an active region such as a transistor region, a MLI 903, and an ILD 905, as previously discussed in FIG. 9. A dielectric layer 150, for example, an oxide layer, is formed over the device layer 30. The dielectric layer 150 may be formed by a technique including CVD, sputtering, or other suitable process to prepare the topmost surface 150' over the primary substrate 10 for subsequent wafer bonding operation. In FIG. 16, a semiconductor substrate 40 is separately prepared and bonding the front side 403 thereof with the topmost surface 150'. In some embodiments, an oxide layer (not shown) is formed over the front side 403 of the semiconductor substrate 40 before the wafer bonding.

Figure 17A:
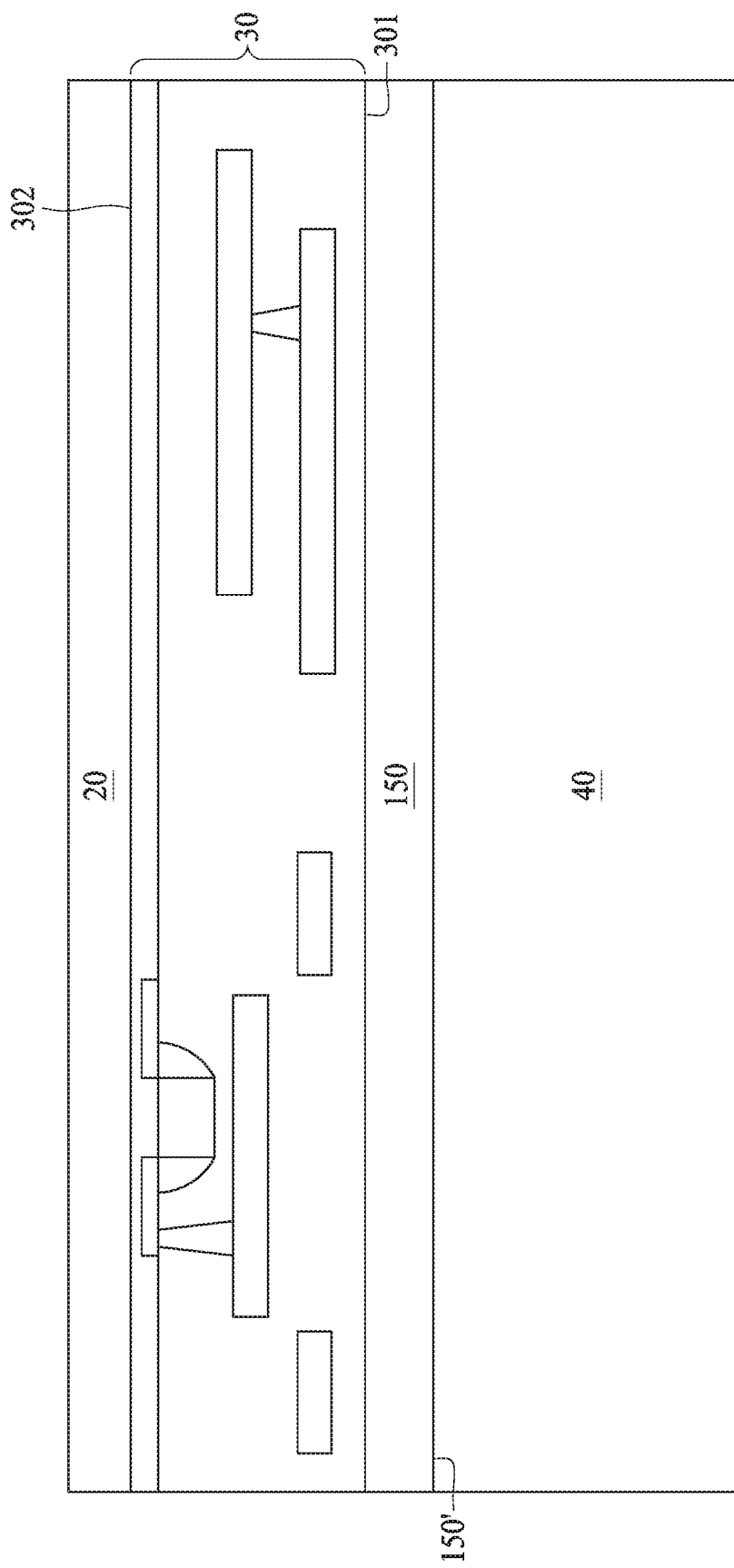
Figure 17B:
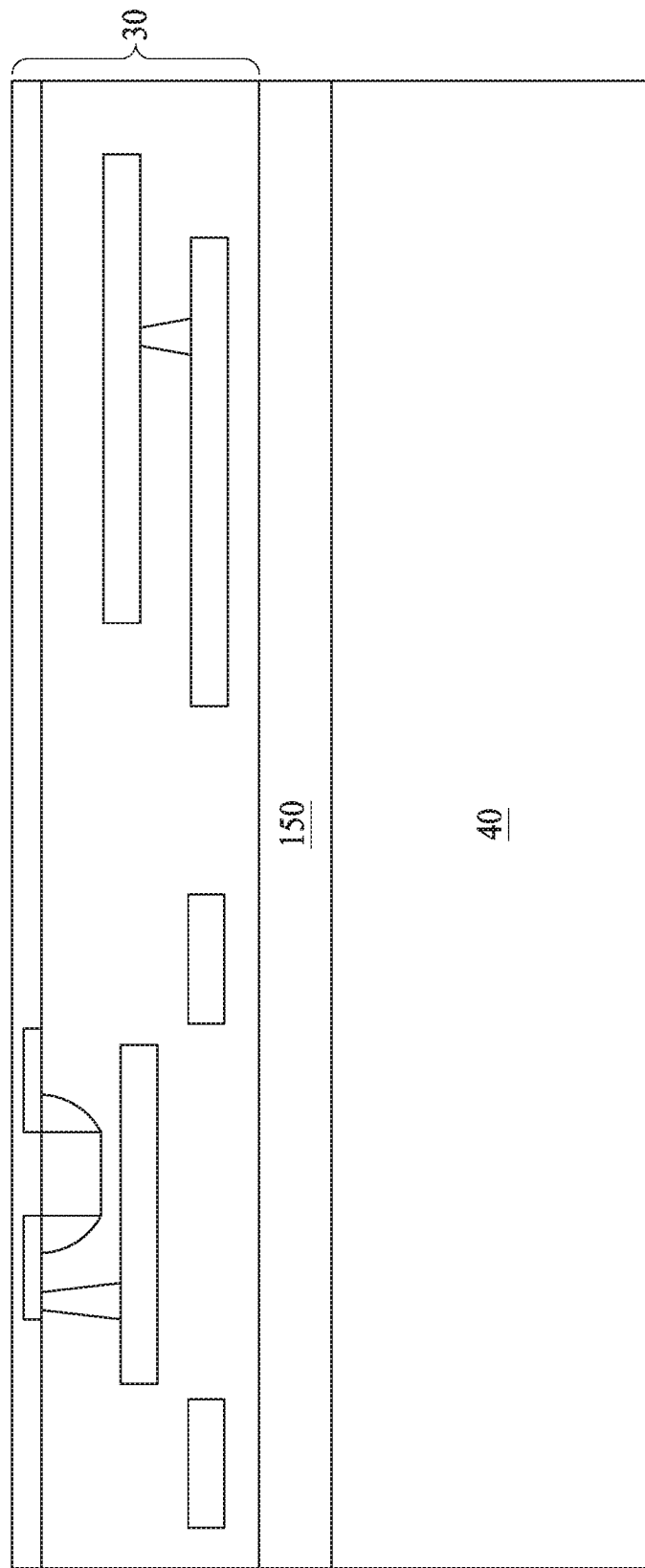

FIG. 17A and FIG. 17B depict two scenario of how the III-V etch stop layer 20 is disposed after bonding to the semiconductor substrate 40 and removing the primary substrate 10. In FIG. 17A, the primary substrate 10, including a P+ or a P− silicon substrate, is removed using the grinding and etching chemistry previously discussed in FIG. 5. In some embodiments, a coarse grinding and a fine grinding is conducted to reduce the thickens of the primary substrate 10 to about 25 μm, followed by a TMAH etch to expose the III-V etch stop layer 20. The resulting cross sectional stack profile is depicted in FIG. 17A. In some embodiments, a TTV of the exposed III-V etch stop layer 20 is less than about 1 nm. Such low TTV over the surface of the III-V etch stop layer 20 can be attributed to the lattice-matched material selection. When the III-V etch stop layer 20 is selected to be GaP, the lattice mismatch between GaP and silicon is less than 0.36% and thus a smooth interface between the GaP and the underlying silicon can be established.

Figure 18:
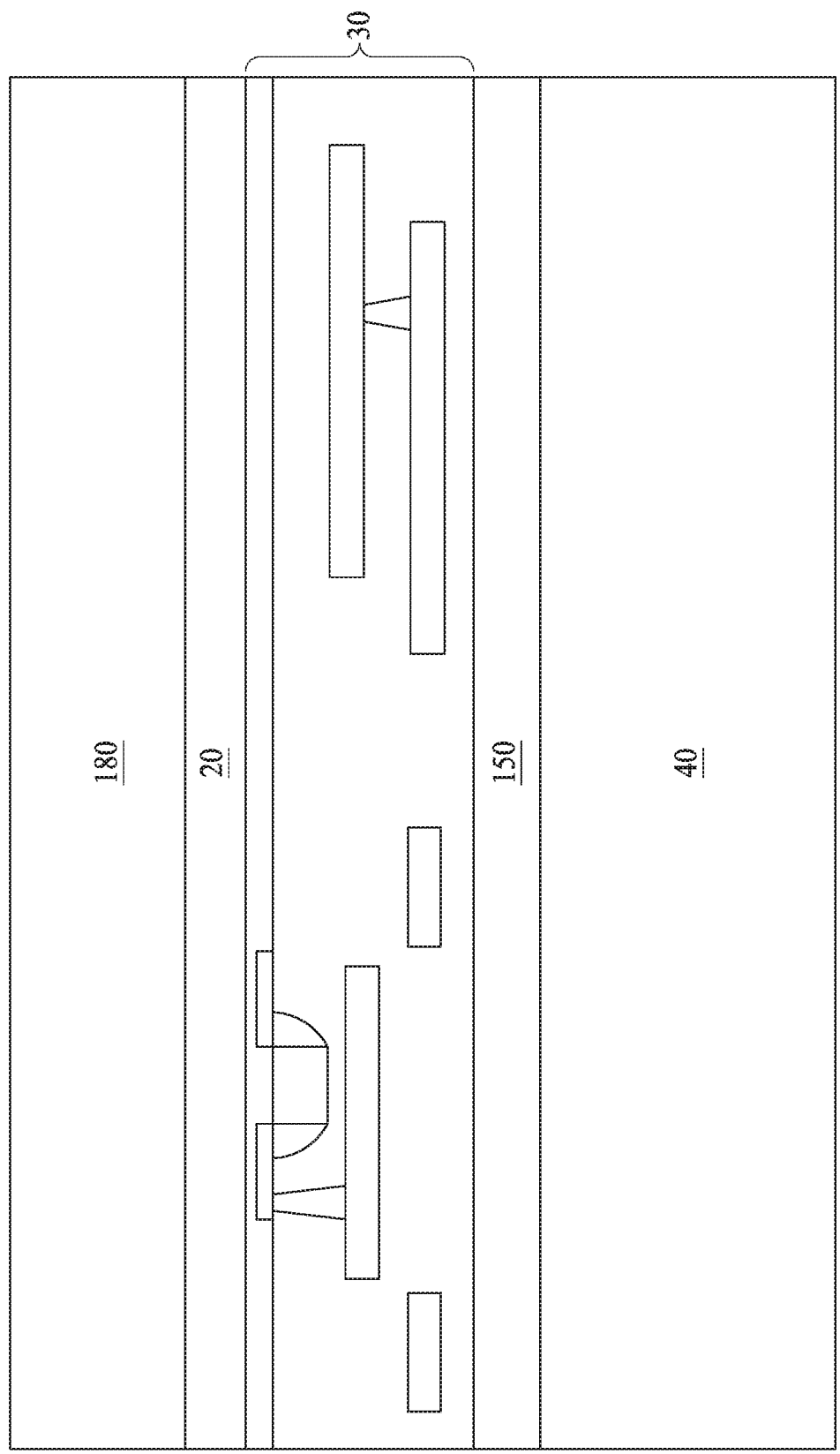
Figure 19:
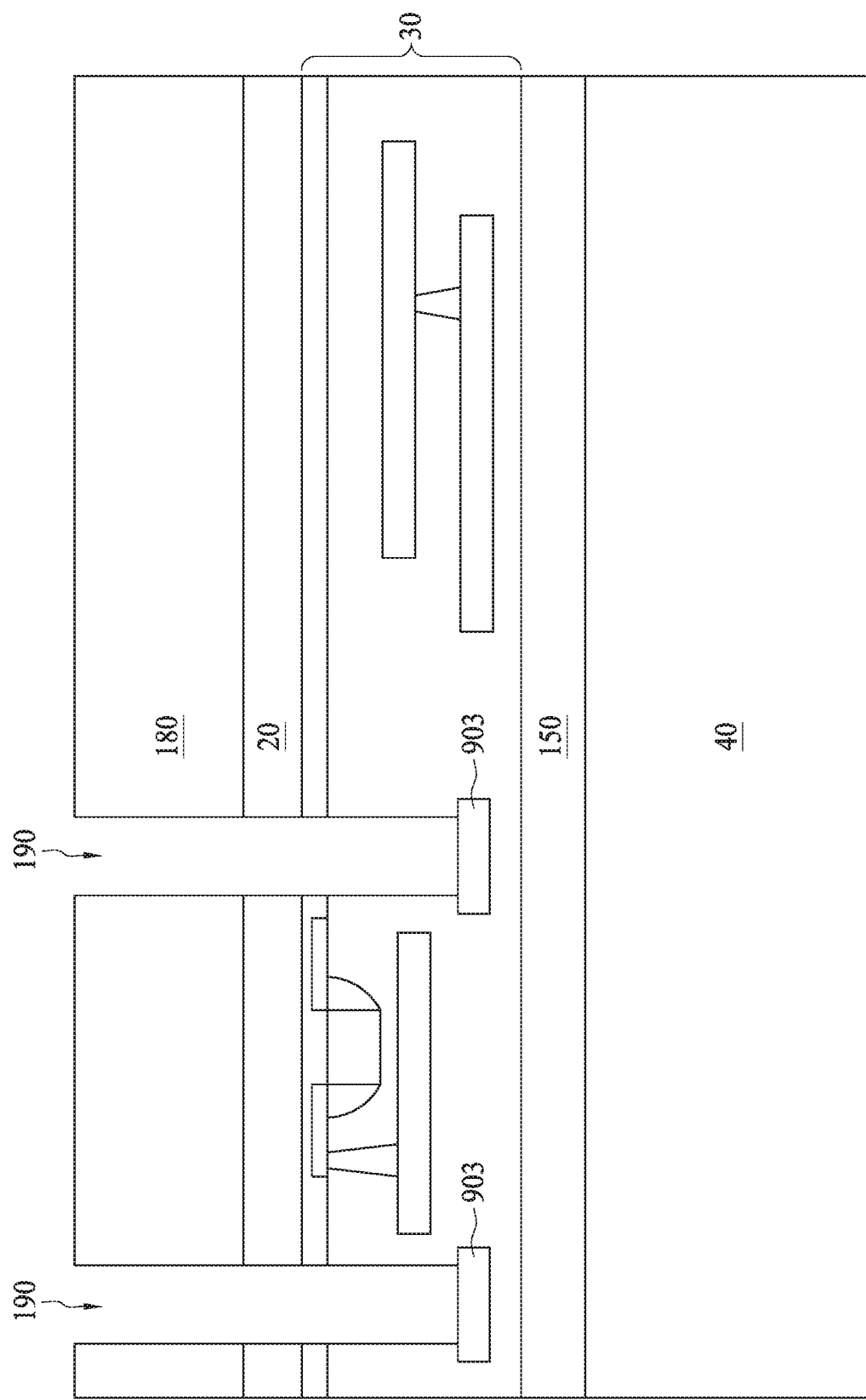
Figure 20:
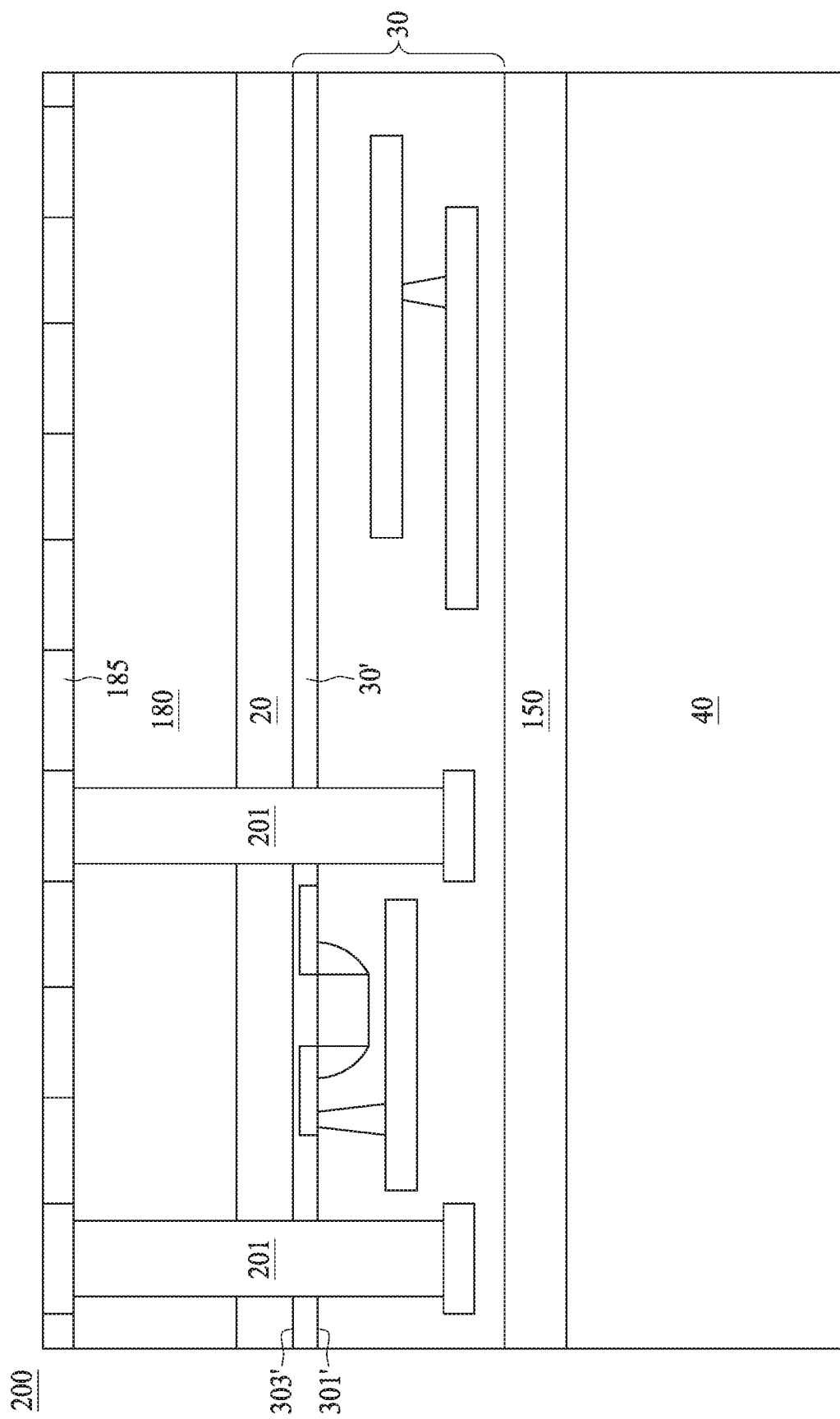

In FIG. 17B, operations are identical as those described in FIG. 17A except for an additional operation of removing the III-V etch stop layer 20 from the second surface 302 of the device layer 30 using a chemistry of $Br_2$ dissolved in methanol under an etching temperature of 20 degrees Celsius. In some embodiments, the III-V etch stop layer 20 is GaP. The Br$_2$/methanol or I$_2$/methanol are adopted to remove the III-V etch stop layer 20 because the selectivity between III-V materials and silicon is high. Removing the III-V etch stop layer 20 is an optional operation and can be adopted if a more silicon-compatible processing is preferred to current manufacturing lines. FIG. 18 to FIG. 20 are depicted following FIG. 17A and thus the III-V etch stop layer 20 can be observed in each of the aforesaid figures.

In FIG. 18, a dielectric layer 180, such as an oxide layer, is formed over the exposed surface of the III-V etch stop layer 20. In FIG. 19, a through hole 190 is patterned and etched from the surface of the dielectric layer 180, through the etch stop layer 20, the device layer 30, and arrive the specific MLI 903 designed for receiving the through hole. In FIG. 20, conductive material is filled into the through hole 190 and form through-silicon vias (TSVs) 201 in a semiconductor structure 200. Generally, TSVs 201 are formed by etching a vertical hole through a substrate and filling the hole with a conductive material, such as copper. The TSVs 201 may be used to provide an electrical contact over a front side 301' of the device layer 30 to semiconductor circuitry on the backside 303' of the device layer 30, or to provide an electrical contact to semiconductor circuitry on a stacked die (not shown). Generally, the process used to form TSVs 201 involves etching a hole at least partially through the silicon substrate of the device layer 30 and, possibly, the overlying dielectric layers 180, 185, the underlying ILD 905, and then depositing copper in the hole. The semiconductor structure 200 of FIG. 20 can be viewed as a reverse SOI structure with respect to a conventional SOI structure. The portion of the device layer 30' having silicon epitaxial layer and the overlying III-V etch stop layer 20 can be viewed as a silicon-on-insulator structure with the silicon under the insulator. Because the silicon substrate on the other side of the III-V etch stop layer 20 is removed completely due to the existence of undoped, high etching selectivity III-V etch stop layer 20, the silicon substrate is replace by dielectric layers 180 and 185 in order to facilitate the formation of the TSVs 201. In FIG. 20m when the etch stop layer 20 over the portion of the device layer 30' is composed of GaP, the reverse SOI structure is having a better thermal expansion coefficient matching with a silicon-based device, as opposed to a conventional SOI structure where the insulator is composed of silicon oxides.

Figure 21:
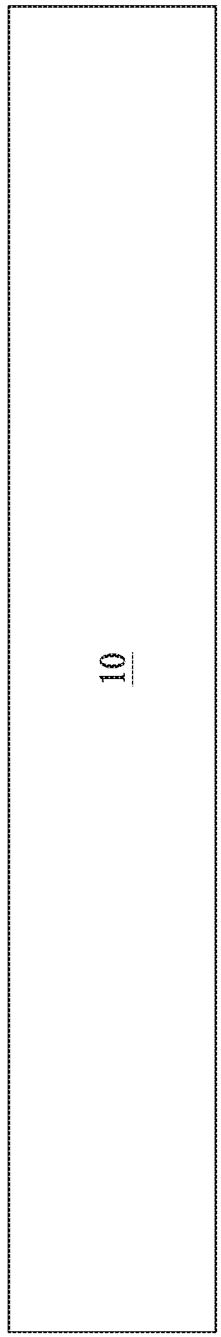
FIG. 21 to FIG. 25 show schematic cross-sectional views of a semiconductor structure and depict the sequence of operations for fabrication the semiconductor structure, according to some embodiments of the present disclosure.
Figure 22:
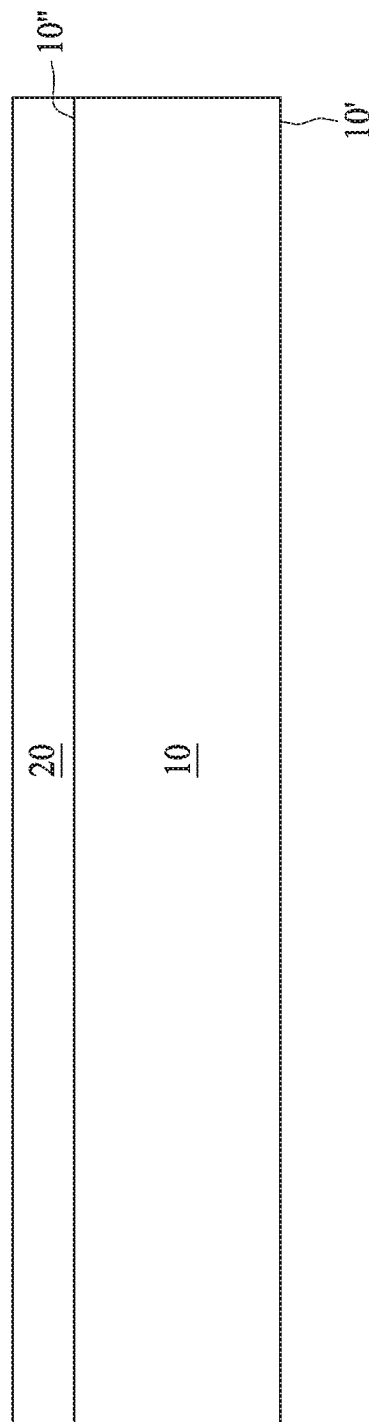
Figure 23:
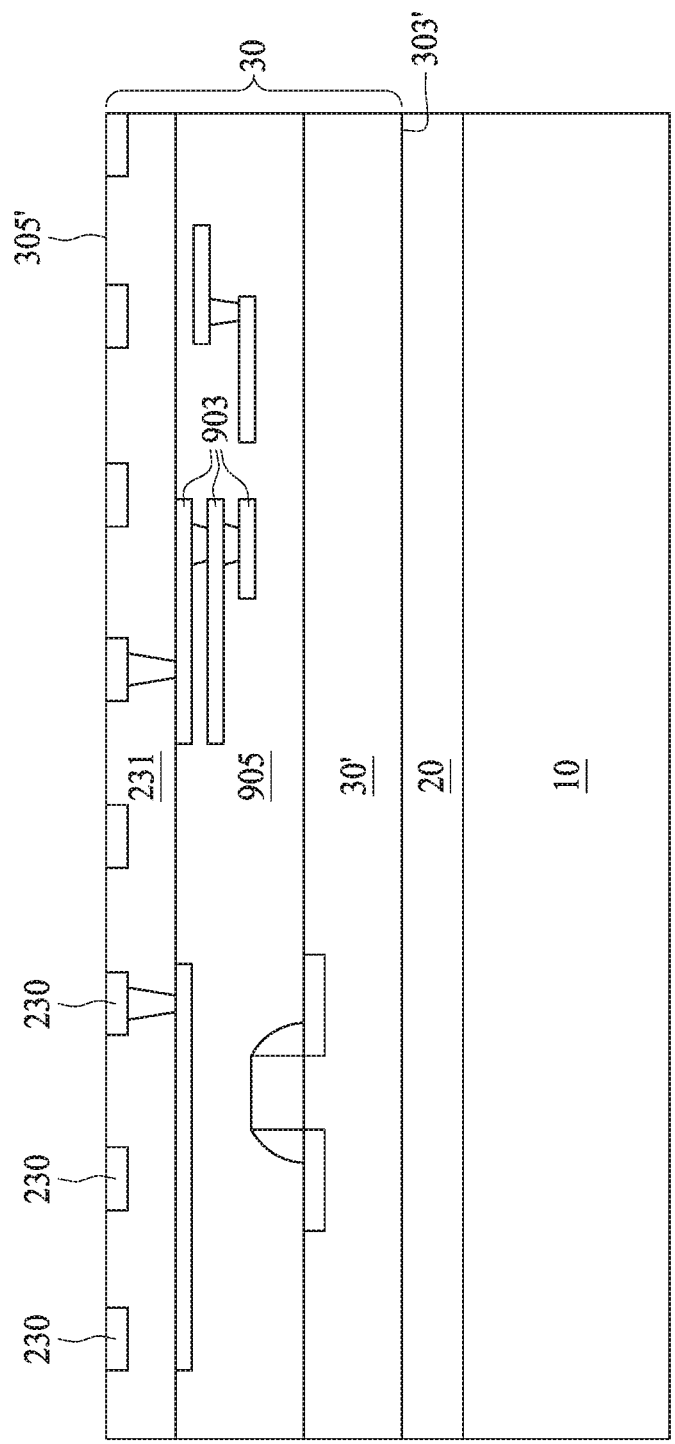

FIG. 21 to FIG. 25 show schematic cross-sectional views of a semiconductor structure 300 (see FIG. 25) and depict the sequence of operations for fabrication the semiconductor structure 300, according to some embodiments of the present disclosure. Numeral labels identical to those in FIG. 1 to FIG. 20 refer to identical elements or equivalents and are not repeatedly introduced. In FIG. 21, the primary substrate 10 acquired can be either a P+ or a P− silicon substrate. In FIG. 22, a III-V etch stop layer 20 is formed over a front side 10''' of the primary substrate 10. The formation of the III-V etch stop layer 20 is previously discussed with respect to FIG. 2 and can be referred thereto. In FIG. 23, a first device layer 30 is formed over the III-V etch stop layer 20. The first device layer 30 can include an active region such as a transistor region close to a second surface 303' thereof, an MLI 903, and an ILD 905, as previously discussed in FIG. 9. A first surface 305' of the first device layer 30 may include conductive trace pattern 230 to facilitate the subsequent device bonding operation. The first device layer 30 and the underlying III-V etch stop layer 20 form an SOI structure, in which case the primary substrate 10 can be removed until the exposure of the III-V etch stop layer 20 in subsequent operations.

Conductive trace pattern 230 are formed by depositing dielectric layer 231, which insulates devices and interconnect traces in the first device layer 30 from any other circuitry or devices in any wafers bonded to the first device layer 30. Recesses are etched into dielectric layer 231 into which a conducting material is deposited to form conductive trace pattern 230. Conductive trace pattern 230 is electrically coupled to the MLI 903 and TSVs (optional, not shown) in the first device layer 30. The insulation material making up dielectric layer 231 is preferably removed or etched to reveal conductive trace pattern 230, or alternatively, slightly elevated above the top of dielectric layer 231.

Figure 24:
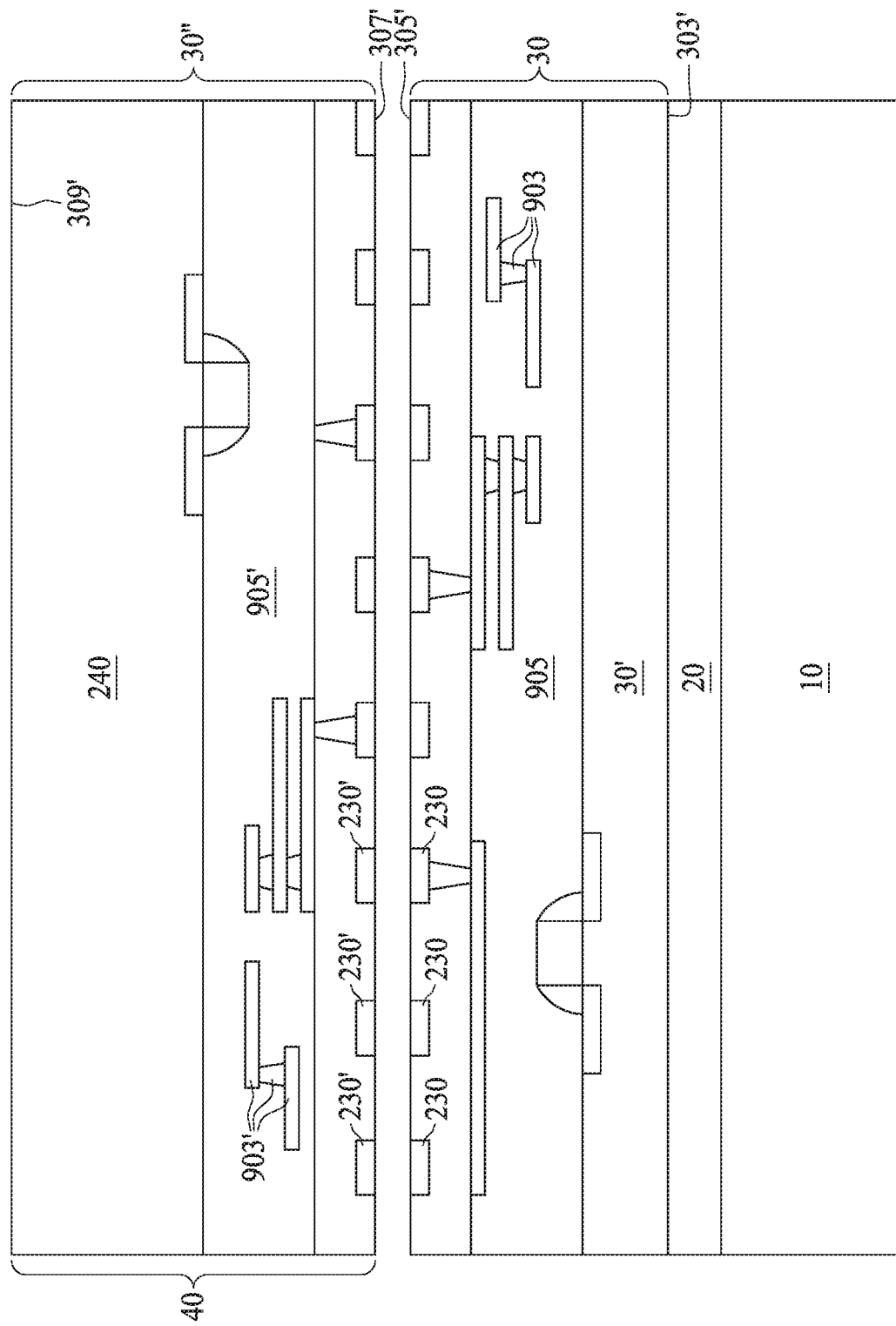

In FIG. 24, a semiconductor substrate 40 including a substrate portion 240 and a second device layer 30'' is separately prepared and bonded to the first surface 305' of the first device layer 30. The second device layer 30'' can include an active region such as a transistor region close to a fourth surface 309' thereof, an MLI 903', and an ILD 905', as previously discussed in FIG. 9. Note the third surface 307' of the second device layer 30'' may include conductive trace pattern 230' to facilitate the device bonding operation. Details regarding the conductive trace pattern 230' can be referred to the conductive trace pattern 230 shown in FIG. 23. In some embodiments, the substrate portion 240 of the semiconductor substrate 40 can either be a bulk silicon substrate or a silicon substrate having a III-V etch stop layer overlaid (not shown).

The first device layer 30 is bonded to the second device layer 30'' to form stacked-dice structure. The first device layer 30 and the second device layer 30'' are aligned and bonded together at conductive trace pattern 230, 230'. In an embodiment, a bonding medium, such as copper, tungsten, a copper-tin alloy, a gold-tin alloy, an indium-gold alloy, a lead-tin alloy, or the like, is applied between the bonding contacts on the to-be-bonded first device layer 30 and the second device layer 30''. In some embodiments, the first device layer 30 and the second device layer 30'' are silicon-based devices. In some other embodiments, one of the first device layer 30 and the second device layer 30'' is silicon-based device, and the other is a III-V-based device.

Figure 25:
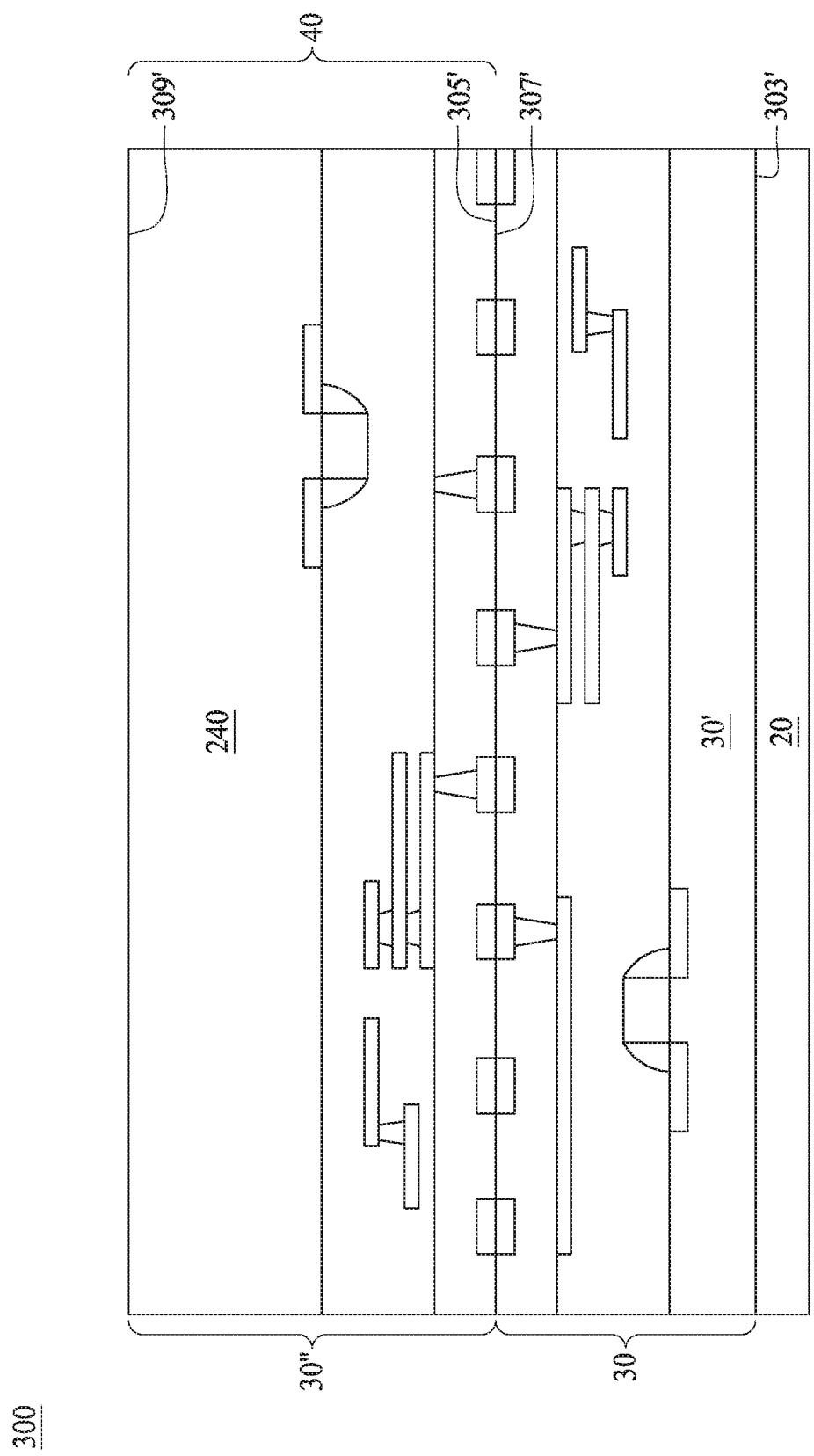

Referring to FIG. 25, after the bonding of the first device layer 30 and the second device layer 30'', the primary substrate 10 of the first deice layer 30 is removed using the etching chemistry described herein. Under the condition where the second device layer 30'' does not have an underlying III-V etch stop layer, the substrate portion 240 of the semiconductor substrate 40 is a carrier substrate. On the other hand, under the condition where the second device layer 30'' having an underlying etch stop layer, the substrate portion 240 of the semiconductor substrate 40 can be removed using the etching chemistry described herein. Optionally, the exposed III-V etch stop layer 20 can be further removed in certain silicon-compatible operations.

It should be noted that, although the first device layer 30 and the second device layer 30'' are illustrated to form a stacked wafer configuration, the specific wafers used herein are not intended to limit the embodiments of the present invention in any way. In practice, first device layer 30 and the second device layer 30'' may be either a wafer or a die, thus the stacked structure may have a die-to-die bonding configuration, a die-to-wafer bonding configuration, or a wafer-to-wafer bonding configuration.

It should also be noted that any number of different devices, components, connectors, and the like may be integrated into first device layer 30 and the second device layer 30''. The specific devices or lack of devices that may be illustrated herein are not intended to limit the embodiments of the present invention in any way.

One embodiment in the present disclosure provides a semiconductor structure, including a first semiconductor device having a first surface and a second surface, the second surface being opposite to the first surface, a semiconductor substrate over the first surface of the first semiconductor device, and a etch stop layer in contact with the second surface of the first semiconductor device.

One embodiment in the present disclosure provides a manufacturing method of a semiconductor structure. The method includes providing a temporary substrate having a first surface, forming a etch stop layer over the first surface, forming a first semiconductor device over the etch stop layer, and removing the temporary substrate by an etching operation and exposing a surface of the etch stop layer.

One embodiment in the present disclosure provides a manufacturing method of a semiconductor structure. The method includes forming a silicon-on-insulator (SOI) structure having a first surface in proximity to an insulator layer, wherein the SOI substrate comprises a first semiconductor device in proximity to the first surface, and thinning the SOT structure from a second surface opposite to the first surface. The thinning the SOI structure comprises exposing the insulator layer of the SOI structure by a basic etch and obtaining a total thickness variation of the exposed insulator layer less than about 1 nm.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor structure, comprising:
   providing a first substrate comprising a semiconductor material and having a first surface and a second surface, the second surface being opposite to the first surface;
   growing a III-V etch stop layer over and in contact with the first surface of the first substrate, wherein the growing the III-V etch stop layer does not intentionally dope the III-V etch stop layer;
   forming a device layer on the III-V etch stop layer, wherein the forming the device layer includes:
      forming a sensing region interfacing the III-V etch stop layer; and
      forming an isolation region on each side of the sensing region;
   bonding a second substrate to the first substrate including the device layer;
   removing the first substrate while the second substrate is bonded to the device layer, wherein the removal includes:
      thinning the first substrate by grinding the first substrate; and
      after the thinning, etching the semiconductor material of the thinned first substrate to expose a surface of the III-V etch stop layer; and
   forming a layer on the exposed surface of the III-V etch stop layer.

2. The method of claim 1, wherein the forming the device layer includes forming a multilayer interconnect (MLI) including a plurality of conductive features disposed in an interlayer dielectric (ILD).

3. The method of claim 2, wherein the bonding the second substrate to the device layer includes forming an interface between the second substrate to the ILD of the device layer.

4. The method of claim 1, wherein the growing the III-V etch stop layer comprises growing undoped gallium phosphide (GaP).

5. The method of claim 1, wherein the bonding the second substrate to the first substrate including the device layer includes forming an interface between the device layer and the second substrate.

6. The method of claim 1, wherein the sensing region is a light-sensing region and the forming the layer on the exposed surface includes forming a color filter aligned with the light-sensing region.

7. The method of claim 6, further comprising:
   forming a lens over the color filter.

8. The method of claim 7, wherein a light sensing region is disposed within the device layer vertically aligned with the III-V etch stop layer, the color filter and the lens.

9. The method of claim 1, wherein the etching the semiconductor material is selective between the semiconductor material and the III-V etch stop layer such that the etching is stopped at a surface of the III-V etch stop layer.

10. The method of claim 1, wherein the etching includes a basic etchant of tetramethylammonium hydroxide (TMAH).

11. The method of claim 1, wherein the providing the first substrate a trilayer of the semiconductor material, an oxide, and another semiconductor material.

12. The method of claim 1, wherein the thinning the first substrate includes a wet etching process followed by at least one of a coarse grinding and a fine grinding.

13. The method of claim 1, wherein the removing the first substrate further comprises: prior to the grinding, performing a wet etching using hydrochloric acid, nitric acid, and acetic acid.

14. A method of fabricating a semiconductor structure, comprising:
   providing a first substrate comprising silicon and having a first surface and a second surface, the second surface being opposite to the first surface;
   growing an undoped gallium phosphide (GaP) layer over and in contact with the first surface of the first substrate, wherein the first surface is silicon;
   forming a device layer on the undoped GaP layer;
   bonding a second substrate to the first substrate including the device layer;
   removing the first substrate while the second substrate is bonded to the device layer, wherein the removal includes:
      thinning the first substrate by grinding the first substrate; and after the thinning, etching the silicon of the thinned first substrate to expose a surface of the undoped GaP layer; and forming a layer on the exposed surface of the undoped GaP layer.

15. The method of claim 14, wherein the forming the device layer includes: forming a light-sensing region, a plurality of transistors, and a multilayer interconnect (MLI), wherein the light-sensing region interfaces the undoped GaP layer.

16. The method of claim 14, wherein the forming the layer on the exposed surface of the undoped GaP layer includes depositing a dielectric material directly on the exposed surface.

17. The method of claim 16, further comprising:
forming a through silicon via extending through the dielectric material and the undoped GaP layer.

18. A method of fabricating a semiconductor structure, comprising:
providing a first substrate comprising a stack of a semiconductor material, another semiconductor material, and an oxide, wherein the first substrate has a first surface of the semiconductor material and a second surface of the oxide, the second surface being opposite to the first surface, wherein the semiconductor material and the another semiconductor material have a different dopant concentration;

growing a III-V etch stop layer over and in contact with the first surface of the first substrate, wherein the growing the III-V etch stop layer does not intentionally dope the III-V etch stop layer;

forming a device layer on the III-V etch stop layer;

bonding a second substrate to the first substrate including the device layer;

removing the first substrate while the second substrate is bonded to the device layer, wherein the removal includes:
thinning the first substrate by grinding the first substrate to remove the oxide and the another semiconductor material; and
after the thinning, etching the semiconductor material of the thinned first substrate to expose a surface of the III-V etch stop layer; and forming a layer on the exposed surface of the III-V etch stop layer.

19. The method of claim 18, wherein the growing the III-V etch stop layer over and in contact with the first surface of the first substrate includes growing an undoped gallium phosphide (GaP) layer in contact with the first surface of the semiconductor material, the semiconductor material being silicon.

20. The method of claim 18, wherein the forming the device layer includes: forming a light-sensing region, a plurality of transistors, and a multilayer interconnect (MLI), wherein the light-sensing region interfaces the III-V etch stop layer.

* * * * *